United States Patent
Amako et al.

(10) Patent No.: US 9,000,472 B2
(45) Date of Patent: Apr. 7, 2015

(54) OPTICAL ASSEMBLY AND METHOD OF FORMING AN OPTICAL ASSEMBLY

(71) Applicants: Dow Corning Corporation, Midland, MI (US); Dow Corning Toray Co., Ltd., Tokyo (JP)

(72) Inventors: Masaaki Amako, Chiba (JP); Steven Swier, Midland, MI (US)

(73) Assignees: Dow Corning Corporation, Midland, MI (US); Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 14/369,981

(22) PCT Filed: Dec. 20, 2012

(86) PCT No.: PCT/US2012/071011
§ 371 (c)(1),
(2) Date: Jun. 30, 2014

(87) PCT Pub. No.: WO2013/101674
PCT Pub. Date: Jul. 4, 2013

(65) Prior Publication Data
US 2015/0001567 A1 Jan. 1, 2015

Related U.S. Application Data

(60) Provisional application No. 61/581,852, filed on Dec. 30, 2011.

(51) Int. Cl.
*H01L 33/00* (2010.01)
*C08G 77/44* (2006.01)
(Continued)

(52) U.S. Cl.
CPC ............ *C09D 183/10* (2013.01); *H01L 33/501* (2013.01); *H01L 33/56* (2013.01); *H01L 2933/005* (2013.01)

(58) Field of Classification Search
None
See application file for complete search history.

(56) References Cited

U.S. PATENT DOCUMENTS 3,294,737 A 12/1966 Krantz
3,328,481 A * 6/1967 Vincent ..................... 525/477
(Continued)

FOREIGN PATENT DOCUMENTS

EP 1801163 A1 6/2007
EP 2450393 A1 5/2012
(Continued)

OTHER PUBLICATIONS

"International Application Serial No. PCT/US2012/071011, International Search Report mailed Apr. 12, 2013", 4 pgs.
(Continued)

*Primary Examiner* — Robert S Loewe
(74) *Attorney, Agent, or Firm* — Schwegman Lundberg & Woessner, P.A.

(57) ABSTRACT

Optical assemblies comprising an optical device and a composition comprising a resin-linear organosiloxane block copolymer are disclosed. In some embodiments, the organosiloxane block copolymers has a weight average molecular weight of at least 20,000 g/mole and includes 40 to 90 mole percent disiloxy units of the formula [$R^1 2SiO_{2/2}$] arranged in linear blocks each having an average of from 10 to 400 disiloxy units [$R^1 2SiO_{2/2}$] per linear block, 10 to 60 mole percent trisiloxy units of the formula [$R^2—SiO_{3/2}$] arranged in non-linear blocks each having a weight average molecular weight of at least 500 g/mol, and 0.5 to 25 mole percent silanol groups. $R^1$ is independently a $C_1$ to $C_{30}$ hydrocarbyl and $R^2$ is independently a $C_1$ to $C_{20}$ hydrocarbyl. At least 30% of the non-linear blocks are crosslinked with another non-linear block and aggregated in nano-domains. Each linear block is linked to at least one non-linear block.

19 Claims, 6 Drawing Sheets

(51) Int. Cl.
*C08G 77/48* (2006.01)
*C09D 183/10* (2006.01)
*H01L 33/50* (2010.01)
*H01L 33/56* (2010.01)

(56) References Cited

U.S. PATENT DOCUMENTS

| | | | | |
|---|---|---|---|---|
| 3,576,905 | A * | 4/1971 | Hartlein et al. | 528/34 |
| 3,619,229 | A * | 11/1971 | Hartlein | 523/209 |
| 3,629,228 | A * | 12/1971 | Hartlein et al. | 528/17 |
| 3,639,155 | A * | 2/1972 | Hartlein et al. | 428/447 |
| 3,647,846 | A * | 3/1972 | Hartlein et al. | 556/436 |
| 3,670,649 | A * | 6/1972 | Hartlein et al. | 102/431 |
| 4,419,402 | A * | 12/1983 | Gutek | 442/145 |
| 4,443,502 | A * | 4/1984 | Gutek | 427/387 |
| 5,281,738 | A * | 1/1994 | Parker et al. | 556/427 |
| 7,312,008 | B2 * | 12/2007 | Wu et al. | 430/66 |
| 2005/0180712 | A1 * | 8/2005 | Shelnut et al. | 385/129 |
| 2007/0122627 | A1 * | 5/2007 | Davis et al. | 428/412 |
| 2009/0050852 | A1 * | 2/2009 | Kanamori et al. | 252/301.36 |
| 2011/0062424 | A1 | 3/2011 | Grunzinger et al. | |

FOREIGN PATENT DOCUMENTS

| | | |
|---|---|---|
| WO | WO-2012/040302 A1 | 3/2012 |
| WO | WO-2012/040367 A1 | 3/2012 |
| WO | WO-2012/040457 A1 | 3/2012 |
| WO | WO-2013/101674 A1 | 7/2013 |

OTHER PUBLICATIONS

"International Application Serial No. PCT/US2012/071011, Written Opinion mailed Apr. 12, 2013", 9 pgs.

* cited by examiner

OPTICAL ASSEMBLY AND METHOD OF FORMING AN OPTICAL ASSEMBLY

CROSS-REFERENCE TO RELATED APPLICATIONS

This application is a U.S. national stage application filed under 35 U.S.C. §371 from International Application Serial No. PCT/US2012/071011, which was filed Dec. 20, 2012, and published as WO 2013/101674 on Jul. 4, 2013, and which claims the benefit of U.S. Provisional Patent Appl. Ser. No. 61/581,852, filed Dec. 30, 2011, which applications and publication are incorporated by reference as if reproduced herein and made a part hereof in their entirety, and the benefit of priority of each of which is claimed herein.

BACKGROUND OF THE DISCLOSURE

Optical assemblies such as solid state lights may use an encapsulant coating to protect an optical device, such as a light emitting diode (LED) from environmental factors. Such protective coatings may be optically clear or generally clear to promote efficiency of such optical devices. Furthermore, these protective coatings may also advantageously be relatively tough, durable, long lasting, and yet easy to apply.

SUMMARY OF THE DISCLOSURE

This disclosure provides an optical assembly (e.g., a solid state light) and a method of forming such an assembly. The optical assembly includes, in some embodiments, an optical device, such as a light emitting diode, and a composition. In some embodiments, the composition is solid. In other embodiments, the composition has a refractive index greater than 1.4. In further embodiments, the composition includes an organosiloxane block copolymer. In still further embodiments, the organosiloxane block copolymer has a weight average molecular weight of at least 20,000 g/mole. In other embodiments, the organosiloxane block copolymer includes 40 to 90 mole percent disiloxy units of the formula $[R^1_2SiO_{2/2}]$ arranged in linear blocks each having an average of from 10 to 400 disiloxy units $[R^1_2SiO_{2/2}]$ per linear block. The organosiloxane block copolymer, in some embodiments, also includes 10 to 60 mole percent trisiloxy units of the formula $[R^2SiO_{3/2}]$ arranged in non-linear blocks each having a weight average molecular weight of at least 500 g/mol. Furthermore, in other embodiments, the organosiloxane block copolymer includes 0.5 to 25 mole percent silanol groups [≡SiOH]. In these formulae, $R^1$ is independently a $C_1$ to $C_{30}$ hydrocarbyl and $R^2$ is independently a $C_1$ to $C_{20}$ hydrocarbyl. In additional embodiments, at least 30% of the non-linear blocks are crosslinked with another non-linear block. In other additional embodiments, the non-linear blocks are aggregated in nano-domains. Furthermore, in some embodiments, each linear block is linked to at least one non-linear block. The method of forming the optical assembly (e.g., solid state light) includes, in some embodiments, the step of combining an optical device (e.g., a light emitting diode) and the composition to form the optical assembly.

In Embodiment 1, the invention relates to a method of forming an optical assembly comprising an optical device and a composition comprising a resin-linear organosiloxane block copolymer, said method comprising the step of combining the optical device and the composition to form the optical assembly.

In Embodiment 2, the invention relates to a method of Embodiment 1, wherein the resin-linear organosiloxane block copolymer has a weight average molecular weight of at least 20,000 g/mole and comprises:
40 to 90 mole percent disiloxy units of the formula $[R^1_2SiO_{2/2}]$ arranged in linear blocks each having an average of from 10 to 400 disiloxy units $[R^1_2SiO_{2/2}]$ per linear block;
10 to 60 mole percent trisiloxy units of the formula $[R^2SiO_{3/2}]$ arranged in non-linear blocks each having a weight average molecular weight of at least 500 g/mol; and
0.5 to 25 mole percent silanol groups [≡SiOH];
wherein $R^1$ is independently a $C_1$ to $C_{30}$ hydrocarbyl and $R^2$ is independently a $C_1$ to $C_{20}$ hydrocarbyl,
wherein at least 30 weight percent of the non-linear blocks are crosslinked with another non-linear block and aggregated in nano-domains, and
wherein each linear block is linked to at least one non-linear block.

In Embodiment 3, the invention relates to a method of Embodiment 1, wherein the optical assembly comprises a solid state light.

In Embodiment 4, the invention relates to a method of Embodiment 1, wherein the optical device comprises coherent light sources or incoherent/partially coherent light sources.

In Embodiment 5, the invention relates to a method of Embodiment 1, wherein the optical device comprises an incoherent/partially coherent light source.

In Embodiment 6, the invention relates to a method of Embodiment 5, wherein the incoherent/partially coherent light source comprises an LED.

In Embodiment 7, the invention relates to a method of any of the preceding embodiments, wherein the step of combining comprises melting the composition such that the composition is disposed on the optical device.

In Embodiment 8, the invention relates to a method of Embodiment 7, wherein the composition is in direct contact with the optical device.

In Embodiment 9, the invention relates to a method of any of the preceding embodiments, further comprising the step of providing a solution of the composition in a solvent.

In Embodiment 10, the invention relates to a method of Embodiment 9, further comprising the step of removing the solvent to form the composition prior to the step of combining the optical device and the composition.

In Embodiment 11, the invention relates to a method of Embodiment 10, further comprising the step of forming the composition into a sheet subsequent to the step of removing the solvent and prior to the step of combining the optical device and the composition.

In Embodiment 12, the invention relates to a method of any of the preceding embodiments, further comprising the step of curing the composition.

In Embodiment 13, the invention relates to a method of Embodiment 12, wherein the curing comprises condensation curing.

In Embodiment 14, the invention relates to a method of Embodiment 12, wherein the step of curing occurs at a temperature higher than the melting temperature of the composition.

In Embodiment 15, the invention relates to a method of any of the preceding embodiments, wherein the optical assembly comprises a phosphor.

In Embodiment 16, the invention relates to a method of Embodiment 15, the composition comprises a phosphor.

In Embodiment 17, the invention relates to a method of any one of Embodiments 2-16, wherein the disiloxy units have the formula $[(CH_3)(C_6H_5)SiO_{2/2}]$.

In Embodiment 18, the invention relates to a method of any one of Embodiments 2-17, wherein the organosiloxane block copolymer comprises at least 30 weight percent disiloxy units.

In Embodiment 19, the invention relates to a method of any one of Embodiments 2-18, wherein $R^2$ is phenyl.

In Embodiment 20, the invention relates to a method of any of the preceding embodiments, wherein the composition has a tensile strength greater than 1.0 MPa and an % elongation at break greater than 20%.

In Embodiment 21, the invention relates to a method of any of the preceding embodiments, wherein the composition has a melt flow temperature of from 25° C. to 200° C.

In Embodiment 22, the invention relates to a method of any of the preceding embodiments, wherein the composition has a storage modulus (G') at 25° C. of from 0.01 MPa to 500 MPa and a loss modulus (G") at 25° C. of from 0.001 MPa to 250 MPa.

In Embodiment 23, the invention relates to a method of Embodiment 16,
wherein the composition has a storage modulus (G') at 120° C. of from 10 Pa to 500,000 Pa and a loss modulus (G") at 120° C. of from 10 Pa to 500,000 Pa.

In Embodiment 24, the invention relates to a method of Embodiment 16 or Embodiment 17, wherein the composition has a storage modulus (G') at 200° C. of from 10 Pa to 100,000 Pa and a loss modulus (G") at 200° C. of from 5 Pa to 80,000 Pa.

In Embodiment 25, the invention relates to a method of any of the preceding embodiments, wherein the composition has greater than 95% light transmittance as determined using ASTM D1003.

In Embodiment 26, the invention relates to a method of any of the preceding embodiments, wherein the composition has a refractive index greater than 1.4.

In Embodiment 27, the invention relates to a method of any of the preceding embodiments, wherein the composition comprises a superbase.

In Embodiment 28, the invention relates to a method of any of the preceding embodiments, wherein the composition comprises a stabilizer.

In Embodiment 29, the invention relates to an optical assembly comprising an optical device and a composition comprising a resin-linear organosiloxane block copolymer.

In Embodiment 30, the invention relates to an optical assembly of Embodiment 29, wherein the resin-linear organosiloxane block copolymer has a weight average molecular weight of at least 20,000 g/mole and comprises:
40 to 90 mole percent disiloxy units of the formula $[R^1{}_2SiO_{2/2}]$ arranged in linear blocks each having an average of from 10 to 400 disiloxy units $[R^1{}_2SiO_{2/2}]$ per linear block;
10 to 60 mole percent trisiloxy units of the formula $[R^2SiO_{3/2}]$ arranged in non-linear blocks each having a weight average molecular weight of at least 500 g/mole; and
0.5 to 25 mole percent silanol groups [≡SiOH];
wherein $R^1$ is independently a $C_1$ to $C_{30}$ hydrocarbyl and $R^2$ is independently a $C_1$ to $C_{20}$ hydrocarbyl,
wherein at least 30 weight percent of the non-linear blocks are crosslinked with another non-linear block and aggregated in nano-domains, and
wherein each linear block is linked to at least one non-linear block.

In Embodiment 31, the invention relates to an optical assembly of Embodiment 29, wherein the optical assembly comprises a solid state light.

In Embodiment 32, the invention relates to an optical assembly of Embodiment 29, wherein the optical device comprises coherent light sources or incoherent/partially coherent light sources.

In Embodiment 33, the invention relates to an optical assembly of Embodiment 29, wherein the optical device comprises an incoherent/partially coherent light source.

In Embodiment 34, the invention relates to an optical assembly of Embodiment 29, wherein the incoherent/partially coherent light source comprises an LED.

In Embodiment 35, the invention relates to the optical assembly of any one of Embodiments 29 or 34, wherein the composition is melted on the optical device such that the composition is disposed on the optical device.

In Embodiment 36, the invention relates to the optical assembly of Embodiment 35, wherein the composition is in direct contact with the optical device.

In Embodiment 37, the invention relates to an optical assembly of Embodiment 29, wherein the composition is cured.

In Embodiment 38, the invention relates to an optical assembly of Embodiment 29, wherein the optical assembly comprises a phosphor.

In Embodiment 39, the invention relates to an optical assembly of any one of Embodiments 29 or 37, wherein, wherein the composition comprises a phosphor.

In Embodiment 40, the invention relates to an optical assembly of any one of Embodiments 29-39, wherein the disiloxy units have the formula $[(CH_3)(C_6H_5)SiO_{2/2}]$.

In Embodiment 41, the invention relates to an optical assembly of any one of Embodiments 29-40, wherein the organosiloxane block copolymer comprises at least 30 weight percent disiloxy units.

In Embodiment 42, the invention relates to an optical assembly of any one of Embodiments 29-41, wherein $R^2$ is phenyl.

In Embodiment 42, the invention relates to an optical assembly of any one of 29-42, wherein the composition has a tensile strength greater than 1.0 MPa and an % elongation at break greater than 20%.

In Embodiment 44, the invention relates to an optical assembly of any one of 29-43, wherein the composition has a melt flow temperature of from 25° C. to 200° C.

In Embodiment 45, the invention relates to an optical assembly of any one of Embodiments 29-44, wherein the composition has a storage modulus (G') at 25° C. of from 0.01 MPa to 500 MPa and a loss modulus (G") at 25° C. of from 0.001 MPa to 250 MPa.

In Embodiment 46, the invention relates to the optical assembly of Embodiment 45, wherein the composition has a storage modulus (G') at 120° C. of from 10 Pa to 500,000 Pa and a loss modulus (G") at 120° C. of from 10 Pa to 500,000 Pa.

In Embodiment 47, the invention relates to the optical assembly of Embodiment 45 or 46, wherein the composition has a storage modulus (G') at 200° C. of from 10 Pa to 100,000 Pa and a loss modulus (G") at 200° C. of from 5 Pa to 80,000 Pa.

In Embodiment 48, the invention relates to an optical assembly of any one of Embodiments 29-47, wherein the composition has greater than 95% light transmittance as determined using ASTM D1003.

In Embodiment 49, the invention relates to an optical assembly of any one of Embodiments 29-48, wherein the composition has a refractive index greater than 1.4.

In Embodiment 50, the invention relates to an optical assembly of any one of Embodiments 29-49, wherein the composition comprises a superbase.

In Embodiment 51, the invention relates to an optical assembly of any one of Embodiments 29-49, wherein the composition comprises a stabilizer.

DESCRIPTION OF THE FIGURES

Other advantages of the present invention will be appreciated, as the same becomes better understood by reference to the following detailed description when described in connection with the accompanying Figures.

DETAILED DESCRIPTION OF THE DISCLOSURE

This disclosure provides an optical assembly (e.g., a solid state light) and a method of forming the assembly. The optical assembly includes, in some embodiments, a light emitting diode and a composition that is a solid (hereafter described as the "solid composition"). In some embodiments, the optical assembly may be in various known applications, optocouplers; optical networks and data transmission; instrument panels and switches; courtesy lighting; turn and stop signals; household appliances; VCR/DVD/stereo/audio/video devices; toys/games instrumentation; security equipment; switches; architectural lighting; signage (e.g., channel letters); machine vision; retail displays; emergency lighting; neon and bulb replacement; flashlights; accent lighting; full color video, monochrome message boards; in traffic, rail, and aviation applications; in mobile phones, PDAs, digital cameras, lap tops; in medical instrumentation; bar code readers; color and money sensors; encoders; optical switches; fiber optic communication; and combinations thereof.

The optical devices can include coherent light sources, such as various lasers known in the art, as well as incoherent/partially coherent light sources, such as light emitting diodes (LED) and various types of LEDs, including semiconductor LEDs, organic LEDs, polymer LEDs, quantum dot LEDs, infrared LEDs, visible light LEDs (including colored and white light), ultraviolet LEDs, and combinations thereof.

Figure 1:
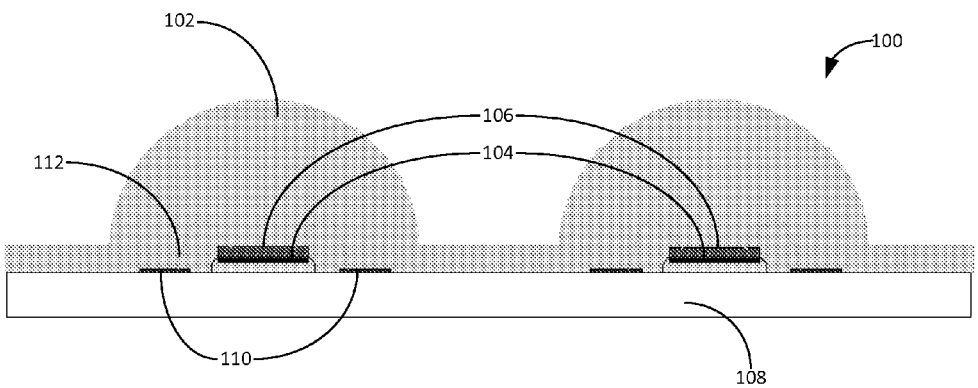
FIG. 1 is an image an abstract example of an optical assembly 100 that may be included in or that may form a solid state light.

FIG. 1 is an image an abstract example of an optical assembly 100 that may be included in or that may form a solid state light. The optical assembly includes an encapsulant 102 made from a composition disclosed herein, optical devices 104, such as an LED, each having an optical surface 106 and each positioned on a substrate 108. The optical device 104 is configured to emit light from the optical surface 106, such as generally orthogonal to the optical surface 106. The encapsulant 102 may be formed by hot-press and compression molding of the composition to the optical devices 104, as illustrated in a mold with dome-shape cavities. The optical assembly 100, as illustrated, further includes an electrode and/or electrical coupler 110 and wire connection 112 from the optical device 104. As illustrated, the composition of the encapsulant 102 is in direct contact with the optical device 104, such that no other compositions or materials are between the encapsulant 102 and the optical device 104 in at least one location. In various alternative examples, one or more additional materials may be disposed between the encapsulant 102 and the optical device 104.

Figure 2:
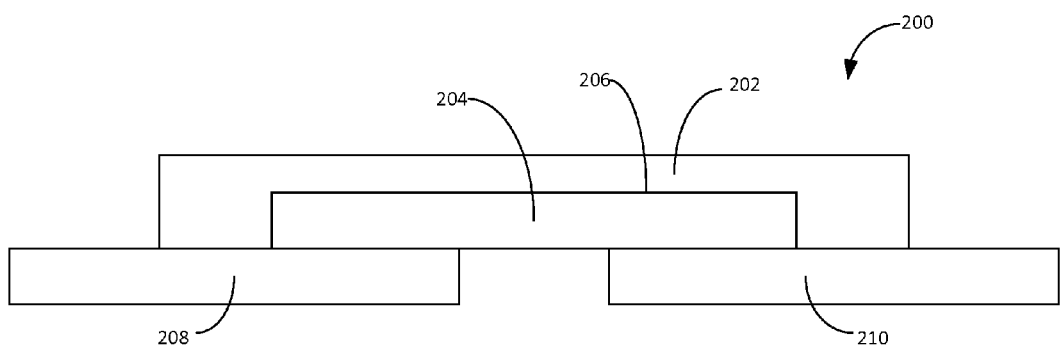
FIG. 2 is an abstract example of an optical assembly 200 that may be included in or that may form a solid state light.

FIG. 2 is an abstract example of an optical assembly 200 that may be included in or that may form a solid state light. An encapsulant 202 covers an optical device 204, such as an LED. The optical device 204 has an optical surface 206 from which light is emitted during operation of the LED. It is noted that the optical assembly is not limited to solid state lights. In certain examples, the optical device 204 is an optical detector and the optical surface 206 receives rather than emits light. The optical device 204, as illustrated, is electrically coupled to and between electrodes (not pictured) respectively positioned on a first substrate 208 and a second substrate 210 at least partially isolated with respect to the first substrate 208.

The optical assemblies 100, 200 are purely illustrative and non-limiting. Various optical assemblies may be formed with the materials disclosed herein according to various processes. The optical assemblies may be formed to various specifications and be utilized for any of a variety of purposes.

The optical assembly of some of the embodiments described herein may also include one or more layers or components known in the art as typically associated with optical assemblies, including solid state lights. For example, the optical assembly may include one or more drivers, optics, heat sinks, housings, lenses, power supplies, fixtures, wires, electrodes, circuits, and the like.

The optical assembly may also include a substrate and/or a superstrate. The substrate may, in some cases, provide protection to a rear surface of the optical assembly, while a superstrate may, in some cases, provide protection to a front surface of the optical assembly. The substrate and the superstrate may be the same or may be different and each may independently include any suitable material known in the art. The substrate and/or superstrate may be soft and flexible or may be rigid and stiff. Alternatively, the substrate and/or superstrate may include rigid and stiff segments while simultaneously including soft and flexible segments. The substrate and/or superstrate may be transparent to light, may be opaque, or may not transmit light (i.e., may be impervious to light). In some embodiments, the superstrate transmits light. In one embodiment, the substrate and/or superstrate includes glass. In another embodiment, the substrate and/or superstrate includes metal foils, polyimides, ethylene-vinyl acetate copolymers, and/or organic fluoropolymers including, but not limited to, ethylene tetrafluoroethylene (ETFE), Tedlar®, polyester/Tedlar®, Tedlar®/polyester/Tedlar®, polyethylene terephthalate (PET) alone or coated with silicon and oxygenated materials (SiOx), and combinations thereof. In one embodiment, the substrate is further defined as a PET/SiOx-PET/Al substrate, wherein x has a value of from 1 to 4.

The substrate and/or superstrate may be load bearing or non-load bearing and may be included in any portion of the optical assembly. In some embodiments, the substrate is load bearing. In some embodiments, the substrate may be a "bottom layer" of the optical assembly that is typically positioned behind a light emitting diode and serves as mechanical support. Alternatively, the optical assembly may include a second or additional substrate and/or superstrate. In some embodiments, the substrate may be the bottom layer of the optical assembly, while a second substrate may be the top layer and function as the superstrate. In some embodiments, the second substrate (e.g., a second substrate functioning as a superstrate) is transparent to light (e.g., visible, UV, and/or infrared light) and is positioned on top of the substrate. The second substrate may be used to protect the optical assembly from environmental conditions, such as rain, snow, and heat. In one embodiment, the second substrate functions as a superstrate and is a rigid glass panel that is transparent to light and is used to protect the front surface of the optical assembly.

In addition, the optical assembly may also include one or more tie layers. The one or more tie layers may be disposed on the substrate to adhere, e.g., a light emitting diode to the substrate. In one embodiment, the optical assembly does not include a substrate and does not include a tie layer. The tie layer may be transparent to UV, infrared, and/or visible light. However, the tie layer may be impermeable to light or opaque. The tie layer may be tacky and may be a gel, gum, liquid, paste, resin, or solid. In one embodiment, the tie layer is a film.

In some embodiments, the optical assembly may include a phosphor. The phosphor is not limited and may include any phosphor known in the art. In one embodiment, the phosphor is made from a host material and an activator, such as copper-activated zinc sulfide and silver-activated zinc sulfide. Suitable, but non-limiting, host materials include oxides, nitrides, oxynitrides, sulfides, selenides, halides or silicates of zinc, cadmium, manganese, aluminum, silicon, or various rare earth metals; or combinations of such oxides, nitrides, oxynitrides, sulfides, selenides, halides or silicates of zinc, cadmium, manganese, aluminum, silicon, or various rare earth metals. Additional suitable phosphors include, but are not limited to, $Zn_2SiO_4$:Mn (Willemite); ZnS:Ag+(Zn,Cd)S:Ag; ZnS:Ag+ZnS:Cu+$Y_2O_2$S:Eu; ZnO:Zn; KCl; ZnS:Ag,Cl or ZnS:Zn; $(KF,MgF_2)$:Mn; (Zn,Cd)S:Ag or (Zn,Cd)S:Cu; $Y_2O_2$S:Eu+$Fe_2O_3$, ZnS:Cu,Al; ZnS:Ag+Co-on-$Al_2O_3$; (KF, $MgF_2$):Mn; (Zn,Cd)S:Cu, Cl; ZnS:Cu or ZnS:Cu,Ag; $MgF_2$:Mn; $(Zn,Mg)F_2$:Mn; $Zn_2SiO_4$:Mn,As; ZnS:Ag+(Zn,Cd)S:Cu; $Gd_2O_2$S:Tb; $Y_2O_2$S:Tb; $Y_3Al_5O_{12}$:Ce; $Y_2SiO_5$:Ce; $Y_3Al_5O_{12}$:Tb; ZnS:Ag,Al; ZnS:Ag; ZnS:Cu,Al or ZnS:Cu, Au,Al; (Zn,Cd)S:Cu, Cl+(Zn,Cd)S:Ag,Cl; $Y_2SiO_5$:Tb; $Y_2OS$:Tb; $Y_3(Al,Ga)_5O_{12}$:Ce; $Y_3(Al,Ga)_5O_{12}$:Tb; $InBO_3$:Tb; $InBO_3$:Eu; $InBO_3$:Tb+$InBO_3$:Eu; $InBO_3$:Tb+$InBO_3$:Eu+ZnS:Ag; $(Ba,Eu)Mg_2Al_{16}O_{27}$; $(Ce,Tb)MgAl_{11}O_{19}$; $BaMgAl_{10}O_{17}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce,Tb; $Zn_2SiO_4$:Mn,$Sb_2O_3$; $CaSiO_3$:Pb,Mn; $CaWO_4$ (Scheelite); $CaWO_4$:Pb; $MgWO_4$; $(Sr,Eu,Ba,Ca)_5(PO4)_3Cl$; $Sr_5Cl(PO_4)_3$:Eu(II); $(Ca,Sr,Ba)_3(PO_4)_2Cl_2$:Eu; $(Sr,Ca,Ba)_{10}(PO_4)_6Cl_2$:Eu; $Sr_2P_2O_7$:Sn(II); $Sr_6P_5BO_{20}$:Eu; $Ca_5F(PO_4)_3$:Sb; $(Ba,Ti)_2P_2O_7$:Ti; $3Sr_3(PO_4)_2.SrF_2$:Sb,Mn; $Sr_5F(PO_4)_3$:Sb,Mn; $Sr_5F(PO_4)_3$:Sb,Mn; $LaPO_4$:Ce,Tb; $(La,Ce,Tb)PO_4$; $(La,Ce,Tb)PO_4$:Ce,Tb; $Ca_3(PO_4)_2.CaF_2$:Ce,Mn; $(Ca,Zn,Mg)_3(PO_4)_2$:Sn; $(Zn,Sr)_3(PO_4)_2$:Mn; $(Sr,Mg)_3(PO_4)_2$:Sn; $(Sr,Mg)_3(PO_4)_2$:Sn(II); $Ca_5F(PO_4)_3$:Sb,Mn; $Ca_5(F,Cl)(PO_4)_3$:Sb,Mn; $(Y,Eu)_2O_3$; $Y_2O_3$:Eu(III); $Mg_4(F)GeO_6$:Mn; $Mg_4(F)(Ge,Sn)O_6$:Mn; $Y(P,V)O_4$:Eu; $YVO_4$:Eu; $Y_2O_2$S:Eu; $3.5MgO.0.5MgF_2.GeO_2$:Mn; $Mg_5As_2O_{11}$:Mn; $SrAl_2O_7$:Pb; $LaMgAl_{11}O_{19}$:Ce; $LaPO_4$:Ce; $SrAl_{12}O_{19}$:Ce; $BaSi_2O_5$:Pb; $SrFB_2O_3$:Eu(II); $SrB_4O_7$:Eu; $Sr_2MgSi_2O_7$:Pb; $MgGa_2O_4$:Mn(II); $Gd_2O_2$S:Tb; $Gd_2O_2$S:Eu; $Gd_2O_2$S:Pr; $Gd_2O_2$S:Pr, Ce,F; $Y_2O_2$S:Tb; $Y_2O_2$S:Eu; $Y_2O_2$S:Pr; Zn(0.5)Cd(0.4)S: Ag; Zn(0.4)Cd(0.6)S:Ag; $CdWO_4$; $CaWO_4$; $MgWO_4$; $Y_2SiO_5$:Ce; $YAlO_3$:Ce; $Y_3Al_5O_{12}$:Ce; $Y_3(Al,Ga)_5O_{12}$:Ce; CdS:In; ZnO:Ga; ZnO:Zn; (Zn,Cd)S:Cu,Al; ZnS:Cu,Al,Au; ZnCdS:Ag,Cu; ZnS:Ag; anthracene, EJ-212, $Zn_2SiO_4$:Mn; ZnS:Cu; NaI:Tl; CsI:Tl; LiF/ZnS:Ag; LiF/ZnSCu,Al,Au, and combinations thereof.

The phosphor may be present in any portion of the optical assembly (e.g., a solid state light). In one embodiment, the phosphor is present in a lens. In another embodiment, the phosphor is present in a layer. In still another embodiment, the phosphor is present in the solid composition (i.e., a solid composition including an organosiloxane block copolymer) itself.

Referring back, the solid composition is "solid," as understood in the art. For example, the solid composition has structural rigidity, resists to changes of shape or volume, and is not a liquid or a gel. In one example, the solid composition is a film. Alternatively, the solid composition may be a pellet, ribbon, sheet, cube, etc. The dimensions of the solid composition are not limited, such that the film, sheet, pellet, etc. may be of any dimensions.

The solid composition includes an organosiloxane block copolymer that may also be described as a "resin-linear" organosiloxane block copolymer. The organosiloxane block copolymers comprises:

40 to 90 mole percent disiloxy units of the formula $[R^1_2SiO_{2/2}]$, 10 to 60 mole percent trisiloxy units of the formula $[R^2SiO_{3/2}]$, 0.5 to 25 mole percent silanol groups [≡SiOH];

wherein:

$R^1$ is independently a $C_1$ to $C_{30}$ hydrocarbyl, $R^2$ is independently a $C_1$ to $C_{20}$ hydrocarbyl;

wherein:

the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mole, at least 30% of the non-linear blocks are crosslinked with each other and are predominately aggregated together in nano-domains, each linear block is linked to at least one non-linear block; and the organosiloxane block copolymer has a weight average molecular weight of at least 20,000 g/mole, and is a solid at 25° C.

The organosiloxane block copolymer of some of the embodiments described herein are referred to as "resin-linear" organosiloxane block copolymers and include siloxy units independently selected from $(R_3SiO_{1/2})$, $(R_2SiO_{2/2})$, $(RSiO_{3/2})$, or $(SiO_{4/2})$ siloxy units, where R may be any organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes typically contain mostly D, or $(R_2SiO_{2/2})$ siloxy units, which results in polydiorganosiloxanes that are fluids of varying viscosities, depending on the "degree of polymerization" or DP as indicated by the number of D units in the polydiorganosiloxane. "Linear" organopolysiloxanes typically have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin". Increasing the amount of T or Q siloxy units in an organopolysiloxane typically results in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1{}_2SiO_{2/2}]$ units) are primarily bonded together to form polymeric chains having, in some embodiments, an average of from 10 to 400 D units (e.g., about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks".

The T units (i.e., $[R^2SiO_{3/2}]$) are primarily bonded to each other to form branched polymeric chains, which are referred to as "non-linear blocks". In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units $[R^1{}_2SiO_{2/2}]$ are arranged in linear blocks having an average of from 10 to 400 disiloxy units $[R^1{}_2SiO_{2/2}]$ per linear block (e.g., about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units $[R^2SiO_{3/2}]$ are arranged in non-linear blocks having a molecular weight of at least 500 g/mole and at least 30% of the non-linear blocks are crosslinked with each other.

The aforementioned formulas may be alternatively described as $[R^1{}_2SiO_{2/2}]_a[R^2SiO_{3/2}]_b$ where the subscripts a and b represent the mole fractions of the siloxy units in the organosiloxane block copolymer. In these formulas, a may vary from 0.4 to 0.9, alternatively from 0.5 to 0.9, and alternatively from 0.6 to 0.9. Also in these formulas, b can vary from 0.1 to 0.6, alternatively from 0.1 to 0.5 and alternatively from 0.1 to 0.4.

$R^1$ in the above disiloxy unit formula is independently a $C_1$ to $C_{30}$ hydrocarbyl. The hydrocarbon group may independently be an alkyl, aryl, or alkylaryl group. As used herein, hydrocarbyl also includes halogen substituted hydrocarbyls, where the halogen may be chlorine, fluorine, bromine or combinations thereof. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

Each $R^2$ in the above trisiloxy unit formula is independently a $C_1$ to $C_{20}$ hydrocarbyl. As used herein, hydrocarbyl also includes halogen substituted hydrocarbyls, where the halogen may be chlorine, fluorine, bromine or combinations thereof. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The organosiloxane block copolymer may include additional siloxy units, such as M siloxy units, Q siloxy units, other unique D or T siloxy units (e.g. having a organic groups other than $R^1$ or $R^2$), so long as the organosiloxane block copolymer includes the mole fractions of the disiloxy and trisiloxy units as described above. In other words, the sum of the mole fractions as designated by subscripts a and b, do not necessarily have to sum to one. The sum of a+b may be less than one to account for amounts of other siloxy units that may be present in the organosiloxane block copolymer. For example, the sum of a+b may be greater than 0.6, greater than 0.7, greater than 0.8, greater than 0.9, greater than 0.95, or greater than 0.98 or 0.99.

In one embodiment, the organosiloxane block copolymer consists essentially of the disiloxy units of the formula $R^1{}_2SiO_{2/2}$ and trisiloxy units of the formula $R^2SiO_{3/2}$, in the aforementioned weight percentages, while also including 0.5 to 25 mole percent silanol groups [≡SiOH], wherein $R^1$ and $R^2$ are as described above. Thus, in this embodiment, the sum of a+b (when using mole fractions to represent the amount of disiloxy and trisiloxy units in the copolymer) is greater than 0.95, alternatively greater than 0.98. Moreover, in this embodiment, the terminology "consisting essentially of" describes that the organosiloxane block copolymer is free of other siloxane units not described herein.

The formula $[R^1{}_2SiO_{2/2}]_a[R^2SiO_{3/2}]_b$, and related formulae using mole fractions, as described herein, do not limit the structural ordering of the disiloxy $R^1{}_2SiO_{2/2}$ and trisiloxy $R^2SiO_{3/2}$ units in the organosiloxane block copolymer. Rather, these formulae provide a non-limiting notation to describe the relative amounts of the two units in the organosiloxane block copolymer, as per the mole fractions described above via the subscripts a and b. The mole fractions of the various siloxy units in the organosiloxane block copolymer, as well as the silanol content, may be determined by $^{29}Si$ NMR techniques.

In some embodiments, the organosiloxane block copolymers contained in the solid forms and solid compositions comprise 40 to 90 mole percent disiloxy units of the formula $[R^1{}_2SiO_{2/2}]$, e.g., 50 to 90 mole percent disiloxy units of the formula $[R^1{}_2SiO_{2/2}]$; 60 to 90 mole percent disiloxy units of the formula $[R^1{}_2SiO_{2/2}]$; 65 to 90 mole percent disiloxy units of the formula $[R^1{}_2SiO_{2/2}]$; 70 to 90 mole percent disiloxy units of the formula $[R^1{}_2SiO_{2/2}]$; or 80 to 90 mole percent disiloxy units of the formula $[R^1{}_2SiO_{2/2}]$; 40 to 80 mole percent disiloxy units of the formula $[R^1{}_2SiO_{2/2}]$; 40 to 70 mole percent disiloxy units of the formula $[R^1{}_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers contained in the solid forms and solid compositions comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

In some embodiments, the organosiloxane block copolymers contained in the solid forms and solid compositions comprise 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent). The silanol groups present on the resin component of the organosiloxane block copolymer may allow the organosiloxane block copolymer to further react or cure at elevated temperatures or to cross-link. The crosslinking of the non-linear blocks may be accomplished via a variety of chemical mechanisms and/or moieties. For example, crosslinking of non-linear blocks within the organosiloxane block copolymer may result from the condensation of residual silanol groups present in the non-linear blocks of the organosiloxane block copolymer.

In some embodiments, the disiloxy units $[R^1_2SiO_{2/2}]$ in the organosiloxane block copolymers contained in the solid forms and solid compositions are arranged in linear blocks having an average of 10 to 400 disiloxy units, e.g., about 10 to about 400 disiloxy units; about 10 to about 300 disiloxy units; about 10 to about 200 disiloxy units; about 10 to about 100 disiloxy units; about 50 to about 400 disiloxy units; about 100 to about 400 disiloxy units; about 150 to about 400 disiloxy units; about 200 to about 400 disiloxy units; about 300 to about 400 disiloxy units; about 50 to about 300 disiloxy units; about 100 to about 300 disiloxy units; about 150 to about 300 disiloxy units; about 200 to about 300 disiloxy units; about 100 to about 150 disiloxy units, about 115 to about 125 disiloxy units, about 90 to about 170 disiloxy units or about 110 to about 140 disiloxy units).

In some embodiments, the non-linear blocks in the organosiloxane block copolymers contained in the solid forms and solid compositions have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to about 2000 g/mole, from about 1000 g/mole to about 1500 g/mole, from about 1000 g/mole to about 1200 g/mole, from about 1000 g/mole to about 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks in the organosiloxane block copolymers contained in the solid forms and solid compositions are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

In some embodiments, the organosiloxane block copolymers contained in the solid forms and solid compositions have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers contained in the solid forms and solid compositions have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In other embodiments, the weight average molecular weight of the organosiloxane block copolymers contained in the solid forms and solid compositions is from 40,000 to 100,000, from 50,000 to 90,000, from 60,000 to 80,000, from 60,000 to 70,000, of from 100,000 to 500,000, of from 150,000 to 450,000, of from 200,000 to 400,000, of from 250,000 to 350,000, or from 250,000 to 300,000, g/mole. In still other embodiments, the organosiloxane block copolymer has a weight average molecular weight of from 40,000 to 60,000, from 45,000 to 55,000, or about 50,000, g/mole.

In some embodiments, the organosiloxane block copolymers of some of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains". As used herein, "predominately aggregated" means the majority of the non-linear blocks of the organosiloxane block copolymer are found in certain regions of the solid composition, described herein as "nano-domains". As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and in some instances lamellar shaped.

In a further embodiment, the solid organosiloxane block copolymers as described above contain a first phase and an incompatible second phase, the first phase containing predominately the disiloxy units $[R^1{}_2SiO_{2/2}]$ as defined above, the second phase containing predominately the trisiloxy units $[R^2SiO_{3/2}]$ as defined above, the non-linear blocks being sufficiently aggregated into nano-domains which are incompatible with the first phase.

When solid compositions are formed from curable compositions of the organosiloxane block copolymers of some of the embodiments described herein, which, in some embodiments also contain an organosiloxane resin (e.g., free resin that is not part of the block copolymer), the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

The solid composition of this disclosure may include phase separated "soft" and "hard" segments resulting from blocks of linear D units and aggregates of blocks of non-linear T units, respectively. These respective soft and hard segments may be determined or inferred by differing glass transition temperatures ($T_g$). Thus a linear segment may be described as a "soft" segment typically having a low $T_g$, for example less than 25° C., alternatively less than 0° C., or alternatively even less than −20° C. The linear segments typically maintain "fluid" like behavior in a variety of conditions. Conversely, non-linear blocks may be described as "hard segments" having higher $T_g$, values, for example greater than 30° C., alternatively greater than 40° C., or alternatively even greater than 50° C.

The advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer the significant advantage of being "re-processable" in conjunction with the benefits typically associated with silicones, such as; hydrophobicity, high temperature stability, moisture/UV resistance.

In one embodiment, a linear soft block siloxane unit, e.g., with a degree of polymerization (dp) >2 (e.g., dp >10; dp >50; dp >100; dp >150; or dp from about 2 to about 150; dp from about 50 to about 150; or dp from about 70 to about 150) is grafted to a linear or resinous "hard block" siloxane unit with a glass transition above room temperature. In a related embodiment, the organosiloxane block copolymer (e.g., silanol terminated organosiloxane block copolymer) is reacted with a silane, such as methyl triacetoxy silane and/or methyl trioxime silane, followed by reaction with a silanol functional phenyl silsesquioxane resin. In still other embodiments, the organosiloxane block copolymer includes one or more soft blocks (e.g., blocks with glass transition <25° C.) and one or more linear siloxane "pre-polymer" blocks that, in some embodiments, include aryl groups as side chains (e.g., poly (phenyl methyl siloxane). In another embodiment, the organosiloxane block copolymer includes PhMe-D contents >20 mole % (e.g., >30 mole %; >40 mole %; >50 mole %; or from about 20 to about 50 mole %; about 30 to about 50 mole %; or from about 20 to about 30 mole %); PhMe-D dp >2 (e.g., dp >10; dp >50; dp >100; dp >150; or dp from about 2 to about 150; dp from about 50 to about 150; or dp from about 70 to about 150); and/or Ph$_2$-D/Me$_2$-D>20 mole % (e.g., >30 mole %; >40 mole %; >50 mole %; or from about 20 to about 50 mole %; about 30 to about 50 mole %; or from about 20 to about 30 mole %), where the mole ratio of Ph$_2$-D/Me$_2$-D is about 3/7. In some embodiments, the Ph$_2$-D/Me$_2$-D mole ratio is from about 1/4 to about 1/2, e.g., about 3/7 to about 3/8. In still other embodiments, the organosiloxane block copolymer includes one or more hard blocks (e.g., blocks with glass transition >25° C.) and one or more linear or resinous siloxanes, for example, phenyl silsesquioxane resins, which may be used to form non-tacky films.

In some embodiments, the solid compositions, which include a resin-linear organosiloxane block copolymer, also contain a superbase catalyst. See, e.g., PCT Appl. No. PCT/US2012/069701, filed Dec. 14, 2012; and U.S. Provisional Appl. No. 61/570,477, filed Dec. 14, 2012, the entireties of which are incorporated by reference as if fully set forth herein. The term "superbase" and "superbase catalyst" are used herein interchangeably. In some embodiments, solid compositions comprising a superbase catalyst exhibit enhanced cure rates, improved mechanical strength, and improved thermal stability over similar compositions without the superbase catalyst.

The term "superbase" is used herein refers to compounds having a very high basicity, such as lithium diisopropylamide. The term "superbase" also encompasses bases resulting from a mixing of two (or more) bases leading to new basic species possessing inherent new properties. The term "superbase" does not necessarily mean a base that is thermodynamically and/or kinetically stronger than another. Instead, in some embodiments, it means that a basic reagent is created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene.

Non-limiting examples of superbases include organic superbases, organometallic superbases, and inorganic superbases.

Organic superbases include, but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase catalyst is an amidine compound.

In some embodiments, the term "superbase" refers to organic superbases having at least two nitrogen atoms and a pK$_b$ of from about 0.5 to about 11, as measured in water. For example, the pK$_b$ is from about 0.5 to about 10, from about 1 to about 5, from about 6 to about 11, from about 3 to about 5, from about 0.5 to about 3 or from about 2 to about 5, as measured in water. In terms of pK$_a$, in some embodiments, superbases have a pK$_a$ of from about 3 to about 13.5, as measured in water. For example, the pK$_a$ is from about 5 to about 10, from about 5 to about 10, from about 8 to about 13.5, from about 6 to about 8, from about 10 to about 12 or from about 9 to about 12, as measured in water. For example, 1,4-diazabicyclo[2.2.2]octane, also known as DABCO, has a pK$_a$ of 2.97 and 8.82 (since it contains two nitrogens); and 1,8-diazabicyclo[5.4.0]undec-7-ene, also known as DBU, has a pK$_a$ of about 12. See, e.g., http://evans.harvard.edu/pdf/evans_pka_table.pdf.

Organometallic superbases include, but are not limited to, organolithium and organomagnesium (Grignard reagent) compounds. In some embodiments, the organometallic superbases are hindered to the extent necessary to make them non-nucleophilic.

Superbases also include mixtures of organic, organometallic, and/or inorganic superbases. A non-limited example of such mixed superbases is the Schlosser base (or Lochmann-Schlosser base), which is the combination of n-butyllithium and potassium tert-butoxide. The combination of n-butyllithium and potassium tert-butoxide form a mixed aggregate of greater reactivity than either reagent alone and with distinctly different properties in comparison to tert-butylpotassium.

Inorganic superbases include salt-like compounds with small, highly charged anions. Non-limiting examples of inorganic superbases include lithium nitride and alkali- and alkali earth metal hydrides including potassium hydride and sodium hydride. Such species are insoluble in all solvents owing to the strong cation-anion interactions, but the surfaces of these materials are highly reactive and slurries can be used.

In certain embodiments of the present invention, the superbase catalyst is an organic superbase, such as any of the organic superbases as described above or known in the art.

In a further embodiment, the superbase catalyst comprises:

1,8-Diazabicyclo [5.4.0]undec-7-ene (DBU), (CAS #6674-22-2)

1,5,7-Triazabicyclo[4.4.0]dec-5-ene (TBD), (CAS #5807-14-7)

1,4-Diazabicyclo[2.2.2]octane (DABCO), (CAS #280-57-9)

1,1,3,3-Tetramethylguanidine (TMG), (CAS #80-70-6)

1,5-Diazabicyclo [4.3.0]-5-nonene (DBN), (CAS #3001-72-7)

7-Methyl-1,5,7-triazabicyclo [4.4.0]dec-5-ene (MTBD) (CAS #84030-20-6)

or combinations thereof.

The structures for each of these are shown below:

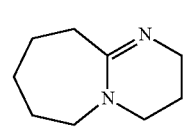

DBU

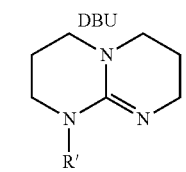

TBD (when R' = H)
MTBD (when R' = CH$_3$)

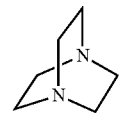

DABCO

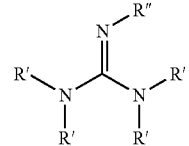

TMG (when R' = CH$_3$ and R" = H)

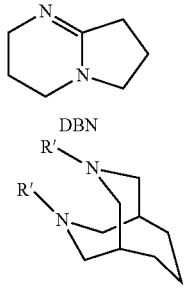

DBN

Bispidine (when R' = H)

where each R' is the same or different and is hydrogen or $C_1$-$C_5$ alkyl; and R" is hydrogen or $C_1$-$C_5$ alkyl. As used herein, the term "$C_1$-$C_5$ alkyl" refers broadly to a straight or branched chain saturated hydrocarbon radical. Examples of alkyl groups include, but are not limited to, straight chained alkyl groups including methyl, ethyl, n-propyl, n-butyl; and branched alkyl groups including isopropyl, tert-butyl, isoamyl, neopentyl, and the like. In some embodiments, the hydrocarbon radical is methyl.

The amount of the superbase catalyst in the solid compositions may vary and is not limiting. Typically, the amount added is a catalytically effective amount, which may vary depending on the superbase selected, as well as the concentration of residual silanol groups in the linear-resin copolymer composition, especially the amount of residual silanol groups on the resin components, and particularly the silanol amount on the "free resin" components in the composition. The amount of superbase catalyst is typically measured in parts per million (ppm) in the solid composition. In particular, the catalyst level is calculated in regard to copolymer solids. The amount of superbase catalyst added to the curable compositions may range from 0.1 to 1,000 ppm, alternatively from 1 to 500 ppm, or alternatively from 10 to 100 ppm, as based on the resin-linear block copolymer content (by weight) present in the solid compositions. For convenience for measuring and adding to the present compositions, the superbase catalyst may be diluted in an organic solvent before adding to the solid compositions. Typically, the superbase in diluted in the same organic solvent as used in the curable compositions.

In some embodiments, the superbase, in its broadest sense, may be considered a silanol condensation enhancing agent and may act as a condensation catalyst. In some embodiments, the silanol condensation enhancing agent may substantially reside in the phase separated resin rich phase and enhances silanol condensation in that phase, thereby reducing the mole % of reactive silanol groups in that phase. While not wishing to be bound by theory, it is believed that the superbase is thought to interact very strongly with acidic SiOH groups of the resin residing in the phase separated resin rich phase. In some embodiments, the silanol condensation enhancing agent will be more likely to reside in the phase separated resin rich phase when the silanol condensation enhancing agent is more compatible (e.g., soluble) with that phase than, e.g., in the organosiloxane block copolymer-rich phase, and less likely to reside in the phase separated resin rich phase when the silanol condensation enhancing agent is less compatible with phase separated resin rich phase. In some embodiments, the mole % of reactive silanol groups in the phase separated resin rich phase is reduced by about 25%, e.g., by about 35%, by about 45%, by about 55%, by about 65%, by about 75%, by about 85%, or by about 95% relative to the mole % reactive silanol groups that would be present in the phase separated resin rich phase if the superbase were not present. In some embodiments, the mole % of reactive silanol groups in the phase separated resin rich phase is reduced from about 25% to about 95%, e.g., from about 25% to about 55%, from about 25% to about 75%, from about 35% to about 75%, from about 55% to about 95% or from about 55% to about 85% relative to the mole % reactive silanol groups that would be present in the phase separated resin rich phase if the superbase were not present.

In some embodiments, the solid compositions, which include a resin-linear organosiloxane block copolymer, also contain a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein. A stabilizer is added to the resin-linear organosiloxane block copolymers, as described above, to improve shelf stability and/or other physical properties of solid compositions containing the organosiloxane block copolymers. The stabilizer may be selected from an alkaline earth metal salt, a metal chelate, a boron compound, a silicon-containing small molecule or combinations thereof.

Although not wishing to be bound by any theory, the stabilizer component may behave as a condensation catalyst. For example, treatment with a salt such as calcium chloride or catalysts like metal chelates (e.g., magnesium acetylacetonate or Al(acac)$_3$) during the synthesis (e.g., at the end of synthesis) of the resin-linear organosiloxane block copolymers of some of the embodiments described herein, greatly increases the stability of the product. This is surprising and unexpected, since catalysts would be expected to reduce shelf stability of the silanol functional copolymers. However, while not being bound by theory, it is believed that, in some cases, the stabilizers may be preferentially soluble in the phase separated resin-rich phase and enhance condensation of the silanol groups present in this phase. Since this phase (i.e., the resin-rich phase) mainly contains residual "free resin", condensation of this phase can subsequently increase the cure temperature of the matrix containing the resin-linear block copolymers. For example, in the absence of the stabilizers of some of the embodiments described herein, a typical resin-linear material with elastomeric behavior (e.g., based on 20 mole % Phenyl-silsesquioxane resin and 184 dp polydimethylsiloxane, also known as "PDMS"), will have a flow onset around 80° C. followed by further condensation cure around 120° C. from residual silanol groups residing on the resin blocks, resulting in a material with tensile strength from 2-5 MPa and elongation at break from 200-600%. The same resin-linear material comprising a stabilizer will have its cure temperature significantly extended from 120 to 180° C.

In sum, in some embodiments, the stabilizer, in its broadest sense, may be considered a silanol condensation enhancing agent (i.e., a condensation catalyst). In some embodiments, the silanol condensation enhancing agent may substantially reside in the phase separated resin rich phase and enhances silanol condensation in that phase, thereby reducing the mole % of reactive silanol groups in that phase. In some embodiments, the silanol condensation enhancing agent will be more likely to reside in the phase separated resin rich phase when the silanol condensation enhancing agent is more compatible (e.g., soluble) with that phase than, e.g., in the organosiloxane block copolymer-rich phase, and less likely to reside in the phase separated resin rich phase when the silanol condensation enhancing agent is less compatible with phase separated resin rich phase. In some embodiments, the mole % of reactive silanol groups in the phase separated resin rich phase is reduced by about 25%, e.g., by about 35%, by about 45%, by about 55%, by about 65%, by about 75%, by about 85%, or by about 95% relative to the mole % reactive silanol groups that would be present in the phase separated resin rich phase if the stabilizer were not present. In some embodiments, the mole % of reactive silanol groups in the phase separated resin rich phase is reduced from about 25% to about 95%, e.g., from about 25% to about 55%, from about 25% to about 75%, from about 35% to about 75%, from about 55% to about 95% or from about 55% to about 85% relative to the mole % reactive silanol groups that would be present in the phase separated resin rich phase if the stabilizer were not present.

The stabilizer ii) is combined with the organosiloxane block copolymer i) as described above. The method by which they are combined may vary and is not limiting, but typically the stabilizer is added to the resin-linear organosiloxane block copolymer or a composition containing the block copolymer. Alternatively, curable compositions containing the two components may be prepared by the methods described further below.

In one embodiment, the stabilizer comprises an alkaline earth metal salt. As used herein the term "alkaline earth metal salt" includes, but is not limited to, salts of magnesium and calcium. Non-limiting examples of salts of magnesium include magnesium chloride. Non-limiting examples of salts of calcium include calcium chloride. For example, calcium chloride enhances the stability of organic solutions of resin-linear organosiloxane block copolymers. The enhanced stability associated with alkaline earth metal salt, as well as or the other stabilizers disclosed herein, may be assessed by monitoring the time needed to gel a solution of the resin-linear organosiloxane block copolymer at slightly elevated temperatures (such as 40° C., see examples for further details). The amount of the alkaline earth metal salt combined with the resin-linear organosiloxane block copolymer may vary, but typically, 1 to 100, alternatively 5 to 50, or alternatively 10 to 25 parts by weight of the alkaline earth metal salt is added for every 100 parts by weight of the resin-linear organosiloxane block copolymer of some of the embodiments described herein.

In another embodiment, the stabilizer comprises a metal chelate such as a metal acetylacetonate (acac). Representative metal acetylacetonate complexes suitable as a stabilizer include, but are not limited to, aluminum, lithium, vanadium, nickel, zirconium, manganese, calcium, and magnesium acetylacetonate complexes. The amount of the metal chelate combined with the resin-linear organosiloxane block copolymer may vary, but typically the amounts are selected based on providing a certain metal concentration in the compositions containing the resin-linear organosiloxane block copolymer. The metal concentrations in the compositions may be expressed in parts per million (ppm). Typically the metal concentrations in the compositions containing the resin-linear organosiloxane block copolymer varies from 1 to 1000 ppm, alternatively 10 to 500 ppm, 100 to 400 ppm, 50 to 300 ppm, 50 to 250 ppm, 50 to 100 ppm, 100 to 250 ppm, 150 to 250 ppm, 150 to 200 ppm or alternatively from 200 to 300 ppm.

In other embodiments, the stabilizer comprises a boron compound. In some embodiments, the boron compound comprises a derivative of boric acid (i.e., derivatives of $B(OH)_3$), compounds that contain B—OH units, or any boron compounds known to affect silanol condensation reactions (e.g., boron nitride and boron oxide). In one embodiment, the stabilizer is a boric acid derivative. Boric acid derivatives include, but are not limited to, boronic acids including isobuteneboronic acid, (2-methylpropyl) boronic acid, phe-nyl boronic acid, $(C_6H_5)B(OH)_2$, and any other boronic acid comprising an aromatic group, including 4-formylphenyl boronic acid, 2-hydroxy-3-methylphenyl boronic acid, (2,6-dimethoxy-4-methylphenyl)boronic acid, (2-fluoro-5-methoxycarbonylphenyl)boronic acid, (3-chloro-2-methylphenyl) boronic acid, (3-ethoxy-5-fluorophenyl)boronic acid, (3-fluoro-5-ethoxycarbonylphenyl)boronic acid, (3-fluoro-5-isopropoxyphenyl)boronic acid, (3-fluoro-5-methoxycarbonylphenyl)boronic acid, (3-fluoro-5-methylphenyl)boronic acid, (3-methoxy-5-(trifluoromethyl)phenyl)boronic acid, (3-t-butyl-5-methylphenyl)boronic acid, (4-bromo-2,5-dimethylphenyl)boronic acid, (4-fluoro-3-methoxyphenyl) boronic acid, (4-methoxy-3-trifluoromethylphenyl)boronic acid, and the like. See, e.g., http://www.sigmaaldrich. com/chemistry/special-offers/boronic-acid.html?cm_sp= Insite-_-ChemSynth-_-BoronicAcidPromo for additional other boronic acid comprising an aromatic group.

The amount of boric acid derivative, compounds that contain B—OH units, or the amount of boron compound known to affect silanol condensation reactions may vary, but typically the amount selected is based on the mole ratio of the OH groups of the boric acid derivative, compounds that contain B—OH units, or the amount of boron compound known to affect silanol condensation reactions to the Si—OZ content (amount of Si—OH or Si-alkoxy) on the resin components of the resin-linear organosiloxane block copolymer compositions. Typically the mole ratio of the OH groups of boric acid derivative, compounds that contain B—OH units, or the amount of boron compound known to affect silanol condensation reactions to the Si—OZ content of the resin-linear organosiloxane block copolymers is 0.1/50, alternatively 0.5/20, or alternatively 1/10. In some embodiments, the mole ratio of the OH groups of boric acid derivative, compounds that contain B—OH units, or the amount of boron compound known to affect silanol condensation reactions to the Si—OZ content of the resin-linear organosiloxane block copolymers is 0.1/50 to 1/10, e.g., from 0.1/50 to 0.5/20, from 0.5/20 to 1/10 or from 0.5/20 to 5/20. In some embodiments, the boric acid derivative comprises phenyl boronic acid.

In some embodiments, the stabilizer comprises a silicon-containing small molecule. As used herein, the term "silicon-containing small molecule" includes, but is not limited to compounds of the formula:

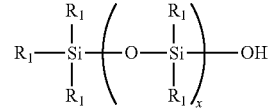

wherein each $R_1$ is the same or different and may be a $C_1$-$C_{30}$ hydrocarbyl group, as the group is defined previously. Non-limiting examples of such silicon-containing small molecules include $Ph_2MeSiOH$ and $Ph_3SiOH$.

The term "silicon-containing small molecule" also includes silanes of the formula:

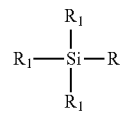

wherein each $R_1$ is the same or different and may be a $C_1$-$C_{30}$ hydrocarbyl group, as the group is defined previously; and R is $R_1$ or hydrogen. Non-limiting examples of such silanes include, but are not limited to triphenyl silane ($Ph_3SiH$) and tetraphenyl silane ($Ph_4Si$).

As used herein, the term "small molecule" refers to molecules not exceeding 1000 g/mole.

In some embodiments, the silicon-containing small molecule stabilizer is used in combination with one or more other stabilizers. For example, the silicon-containing small molecule could be used in combination with an alkaline earth metal salt, a metal chelate or a boron compound. In some embodiments, the silicon-containing small molecule is used in combination with a metal chelate (e.g., $Al(acac)_3$). In some embodiments, the silicon-containing small molecule stabilizer is added during the preparation/synthesis of the block copolymers of some of the embodiments described herein. In other embodiments, the silicon-containing small molecule stabilizer is added after the block copolymers of some of the embodiments described herein have been prepared/synthesized.

In some embodiments, the amount of the silicon-containing small molecule that me be used is less than 15 wt %, e.g., less than 10 wt %, less than 5 wt %, less than 2 wt %, less than 1 wt % or less than 0.5 wt %. In some embodiments, the amount of the silicon-containing small molecule that me be used is from about 0.1 wt % to about 10 wt %, e.g., from about 0.1 wt % to about 0.5 wt %, from about 0.25 wt % to about 1 wt %, from about 1 wt % to about 5 wt %, from about 2 wt % to about 10 wt % or from about 2 wt % to about 5 wt %.

Non-Limiting Physical Properties of the Solid Composition:

The physical properties of the solid composition of some of the embodiments described herein are not limited. In some embodiments, the solid composition has a viscosity greater than 100 cSt at 120° C. or greater than 1000 cSt at 120° C., greater than 5000 cSt at 120° C. or greater than 10,000 cSt at 120° C., and, in some instances, may have an infinite viscosity. In some embodiments, the solid composition has a viscosity of from about 100 cSt to about 10,000 cSt at 120° C.; e.g., from about 1000 cSt to about 5000 cSt at 120° C.; from about 500 cSt to about 2000 cSt at 120° C.; from about 2000 cSt to about 5000 cSt or from about 5000 cSt to about 10,000 cSt at 120° C.

In some embodiments, the solid composition has a refractive index greater than 1.4 and may have a refractive index greater than 1.44, 1.5, 1.54, or alternatively greater than 1.55, as determined using ASTM D542. In some embodiments, the solid composition has a refractive index greater than 2.5.

In other embodiments, the solid composition has a refractive index of from about 1.4 to about 2.5, e.g., from about 1.5 to about 2.5; from about 1.7 to about 2.4; from about 1.4 to about 1.7; or from about 1.9 to about 2.3.

In other embodiments, the solid composition has greater than 50, 55, 60, 65, 70, 75, 80, 85, 90, 95, 96, 97, 98, or 99, or about 100, % light transmittance. The light transmittance is typically determined using ASTM E-903-96 or a modified version of ASTM D1003, which specifies how to measure light transmittance using a class C light source. In the modified version, the class C light source is replaced with a light source that produces the solar spectrum (i.e., the AM 1.5G spectrum). Spectral transmittance values are also independent of reflective losses in the modified method in contrast to ASTM D1003. Measurements are acquired using a Varian Cary 5000 between 200-1700 nm.

In some embodiments, the solid composition of some of the embodiments described herein has one or more, in some cases all, of the following characteristics: resists yellowing; resists light absorption losses; has increased toughness; has excellent thermal stability; exhibits excellent flexibility in processing (e.g., B-staged films can be pre-cured, but can re-flow after curing); and/or exhibits adhesion to numerous types of surfaces, in some cases, without a need for adhesion promoters. In addition, the solid composition of some of the embodiments described herein can maintain its refractive index even when its mechanical properties are manipulated and customized. Moreover, PDMS resin-linears may be utilized wherein the linear and the resin block have refractive indices that are dissimilar (e.g. RI $Me_2$-D=1.41 and RI Ph-T=1.56). Furthermore, the solid composition can be tailored to have a (high) refractive index which may be matched or similar to a refractive index of a superstrate such as front glass, which increases efficiency. Moreover, the solid composition, in some embodiments, offers excellent melt flowability simultaneously with shelf stability.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

In some embodiments, the solid composition of the embodiments of the present invention retain certain physical properties such as tensile strength and % elongation at break, upon heat aging. In one embodiment, the tensile strength of the solid composition remains within 20%, alternatively within 10%, or alternatively within 5% of its original value upon heat aging at 200° C. for 1000 hours. In some embodiments, the tensile strength of the solid composition remains within from about 20% to about 1% of its original value, e.g., from about 10% to about 1%, from about 10% to about 5% or from about 5% to about 1% of its original value upon heat aging at 200° C. for 1000 hours. In some embodiments, heat aging may be conducted by heating samples within an air circulating oven at elevated temperatures and for an extended period of time (e.g., about 150-300° C. for about 50 to about 10,000 hours). In some embodiments, the tensile strength of the solid composition remains within about 1% or remains the same as its original value upon heat aging at 200° C. for 1000 hours. In other embodiments, the % elongation at break is at least 10%, alternatively 50%, or alternatively 75% upon heat aging at 200° C. for 1000 hours. In some embodiments, the % elongation at break is from about 10% to about 90%, e.g., from about 10% to about 50%, from about 25% to about 60%, from about 40% to about 60% or from about 50% to about 75% upon heat aging at 200° C. for 1000 hours.

In one embodiment, the solid compositions of the organosiloxane block copolymers may be considered as "melt processable". In this embodiment, the solid compositions, such as a coating formed from a film of a solution containing the organosiloxane block copolymers, exhibit fluid behavior at elevated temperatures, that is upon "melting". The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta as a function of temperature storage using commercially available instruments. For example, a commercial rheometer (such as TA Instruments' ARES-RDA—with 2KSTD standard flexular pivot spring transducer, with forced convection oven) may be used to measure the storage modulus (G'), loss modulus (G") and tan delta as a function of temperature. Test specimens (typically 8 mm wide, 1 mm thick) may be loaded in between parallel plates and measured using small strain oscillatory rheology while ramping the temperature in a range from 25° C. to 300° C. at 2° C./min (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). Typically, the FLOW of the solid compositions will also correlate to the glass transition temperature of the non-linear segments (i.e., the resin component) in the organosiloxane block copolymer.

In some embodiments, the tan delta=1 is from about 3 to about 5 hours at 150° C., e.g., from about 3 to about 5 minutes at 150° C., from about 10 to about 15 minutes at 150° C., from about 10 to about 12 minutes at 150° C., from about 8 to about 10 minutes at 150° C., from about 30 minutes to about 2.5 hours at 150° C., from about 1 hour to about 4 hours at 150° C. or from about 2.5 hours to about 5 hours at 150° C. In other embodiments, e.g., when a superbase is used, the tan delta=1 is from about 3 to about 60 seconds at 150° C., e.g., from about 3 to about 30 seconds at 150° C., from about 10 to about 45 seconds at 150° C., from about 5 to about 50 seconds at 150° C., from about 10 to about 30 seconds at 150° C. or from about 30 seconds to about 60 seconds at 150° C. In still other embodiments, e.g., when a superbase is used, the tan delta=1 is from about 5 to about 1200 seconds at 120° C., e.g., from about 20 to about 60 seconds at 120° C., from about 20 to about 600 seconds at 120° C., from about 60 to about 1200 seconds at 120° C., from about 5 to about 100 seconds at 120° C., from about 10 to about 60 seconds at 120° C. or from about 30 seconds to about 60 seconds at 120° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one embodiment, the solid compositions of the organosiloxane block copolymers may be considered as "curable". In this embodiment, the solid compositions, such as a coating formed from a film of a solution containing the organosiloxane block copolymers, may undergo further physical property changes by further curing the block copolymer. As discussed above, the present organosiloxane block copolymers contain a certain amount of silanol groups. It is believed that the presence of these silanol groups on the block copolymer permit further reactivity, i.e., a cure mechanism. Upon curing, the physical properties of solid compositions may be further altered, as discussed in certain embodiments below.

Alternatively, the "melt processability" and/or cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

The structural ordering of the disiloxy and trisiloxy units in the organosiloxane block copolymer as described above may provide the organosiloxane block copolymer with certain unique physical property characteristics when the solid composition are formed. For example, the structural ordering of the disiloxy and trisiloxy units in the copolymer may provide solid composition that allow for a high optical transmittance of visible light. The structural ordering may also allow the organosiloxane block copolymer to flow and cure upon heating, yet remain stable at room temperature. The siloxy units may also be processed using lamination techniques. These properties may be useful to provide coatings for various electronic articles to improve weather resistance and durability, while providing low cost and easy procedures that are energy efficient.

Curable Silicone Composition:

This disclosure also provides a curable silicone composition. The curable silicone composition includes the organosiloxane block copolymer described above. In some embodiments, the curable silicone composition also includes an organic solvent. In some embodiments, the term "curable silicone composition" also includes a combination of the solid composition in, or combined with, a solvent. The organic solvent, in some embodiments, is an aromatic solvent, such as benzene, toluene, or xylene.

The curable compositions of some of the embodiments described herein may further contain an organosiloxane resin (e.g., free resin that is not part of the block copolymer). The organosiloxane resin present in these compositions typically will be the organosiloxane resin used to prepare the organosiloxane block copolymer. Thus, the organosiloxane resin may comprise at least 60 mole % of [$R^2SiO_{3/2}$] siloxy units in its formula (e.g., at least 70 mole % of [$R^2SiO_{3/2}$] siloxy units, at least 80 mole % of [$R^2SiO_{3/2}$] siloxy units, at least 90 mole % of [$R^2SiO_{3/2}$] siloxy units, or 100 mole % of [$R^2SiO_{3/2}$] siloxy units; or 60-100 mole % [$R^2SiO_{3/2}$] siloxy units, 60-90 mole % [$R^2SiO_{3/2}$] siloxy units or 70-80 mole % [$R^2SiO_{3/2}$] siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

When the curable composition includes organosiloxane block copolymer, organic solvent, and optional organosiloxane resin, the amounts of each component may vary. The amount of the organosiloxane block copolymers, organic solvent, and optional organosiloxane resin in the present curable composition may vary. The curable composition of the present disclosure may contain:

- 40 to 80 weight % of the organosiloxane block copolymer as described above (e.g., 40 to 70 weight %, 40 to 60 weight %, 40 to 50 weight %);
- 10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight; and
- 5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %).

Such that the sum of the weight % of these components does not exceed 100%.

In one embodiment, the curable compositions consist essentially of the organosiloxane block copolymer as described above, the organic solvent, and the organosiloxane resin. In this embodiment, the weight % of these components sum to 100%, or nearly 100%. The terminology "consisting essentially of" relative to the immediately aforementioned embodiment, describes that, in this embodiment, the curable silicone composition is free of silicone or organic polymers that are not the organosiloxane block copolymer or organosiloxane resin of this disclosure.

The curable silicone composition may also include a cure catalyst. The cure catalyst may be chosen from any catalyst known in the art to affect (condensation) cure of organosiloxanes, such as various tin or titanium catalysts. Condensation catalysts can be any condensation catalyst typically used to promote condensation of silicon bonded hydroxy (=silanol) groups to form Si—O—Si linkages. Examples include, but are not limited to, amines, complexes of lead, tin, titanium, zinc, and iron.

In one embodiment, a linear soft block siloxane unit, e.g., with a degree of polymerization (dp)>2 (e.g., dp >10; dp >50; dp >100; dp >150; or dp from about 2 to about 150; dp from about 50 to about 150; or dp from about 70 to about 150) is grafted to a linear or resinous "hard block" siloxane unit with a glass transition above room temperature. In a related embodiment, the organosiloxane block copolymer (e.g., silanol terminated organosiloxane block copolymer) is reacted with a silane, such as methyl triacetoxy silane and/or methyl trioxime silane, followed by reaction with a silanol functional phenyl silsesquioxane resin. In still other embodiments, the organosiloxane block copolymer includes one or more soft blocks (e.g., blocks with glass transition <25° C.) and one or more linear siloxane "pre-polymer" blocks that, in some embodiments, include aryl groups as side chains (e.g., poly (phenyl methyl siloxane). In another embodiment, the organosiloxane block copolymer includes PhMe-D contents >20 mole % (e.g., >30 mole %; >40 mole %; >50 mole %; or from about 20 to about 50 mole %; about 30 to about 50 mole %; or from about 20 to about 30 mole %); PhMe-D dp >2 (e.g., dp >10; dp >50; dp >100; dp >150; or dp from about 2 to about 150; dp from about 50 to about 150; or dp from about 70 to about 150); and/or $Ph_2$-D/$Me_2$-D>20 mole % (e.g., >30 mole %; >40 mole %; >50 mole %; or from about 20 to about 50 mole %; about 30 to about 50 mole %; or from about 20 to about 30 mole %), where the mole ratio of $Ph_2$-D/$Me_2$-D is about 3/7. In some embodiments, the $Ph_2$-D/$Me_2$-D mole ratio is from about 1/4 to about 1/2, e.g., about 3/7 to about 3/8. In still other embodiments, the organosiloxane block copolymer includes one or more hard blocks (e.g., blocks with glass transition >25° C.) and one or more linear or resinous siloxanes, for example, phenyl silsesquioxane resins, which may be used to form non-tacky films.

Method of Forming the Solid Composition:

The solid composition of this invention may be formed by a method that includes the step of reacting one or more resins, such as Phenyl-T resins, with one or more (silanol) terminated siloxanes, such as PhMe siloxanes. Alternatively, one or more resins may be reacted with one or more capped siloxane resins, such as silanol terminated siloxanes capped with MTA/ETA, MTO, ETS 900, and the like. In another embodiment, the solid composition is formed by reacting one or more components described above and/or one or more components described in U.S. Prov. Patent Appl. Ser. Nos. 61/385,446, filed Sep. 22, 2010; 61/537,146, filed Sep. 21, 2011; 61/537,151, filed Sep. 21, 2011; and 61/537,756, filed Sep. 22, 2011; and/or described in Published PCT Appl. Nos. WO2012/040302; WO2012/040305; WO2012/040367; WO2012/040453; and WO2012/040457, all of which are expressly incorporated herein by reference. In still another embodiment, the method may include one or more steps described any of the aforementioned applications.

Alternatively, the method may include the step of providing the composition in a solvent, e.g., a curable silicone composition that includes a solvent, and then removing the solvent to form the solid composition. The solvent may be removed by any known processing techniques. In one embodiment, a film including the organosiloxane block copolymer is formed and the solvent is allowed to evaporate from a curable silicone composition thereby forming a film. Subjecting the films to elevated temperatures, and/or reduced pressures, will accelerate solvent removal and subsequent formation of the solid composition. Alternatively, a curable silicone composition may be passed through an extruder to remove solvent and provide a solid composition in the form of a ribbon or pellets. Coating operations against a release film can also be used as in slot die coating, knife over roll coating, rod coating, or gravure coating. Also, roll-to-roll coating operations can be used to prepare a solid film. In coating operations, a conveyer oven or other means of heating and evacuating the solution can be used to drive off the solvent and obtain a solid composition.

Method of Forming the Organosiloxane Block Copolymer:

The organosiloxane block copolymer may be formed using a method that includes the step of I) reacting a) a linear organosiloxane and b) an organosiloxane resin comprising at least 60 mole % of [$R^2SiO_{3/2}$] siloxy units in its formula, in c) a solvent. In one embodiment, the linear organosiloxane has the formula $R^1_q(E)_{(3-q)}SiO(R^1_2SiO_{2/2})_nSi(E)_{(3-q)}R^1_q$, wherein each $R^1$ is independently a $C_1$ to $C_{30}$ hydrocarbyl, n is 10 to 400, q is 0, 1, or 2, E is a hydrolyzable group including at least one carbon atom. In another embodiment, each $R^2$ is independently a $C_1$ to $C_{20}$ hydrocarbyl. In still another embodiment, the amounts of a) and b) used in step I are selected to provide the organosiloxane block copolymer with 40 to 90 mole % of disiloxy units [$R^1_2SiO_{2/2}$] and 10 to 60 mole % of trisiloxy units [$R^2SiO_{3/2}$]. In an even further embodiment, at least 95 weight percent of the linear organosiloxane added in step I is incorporated into the organosiloxane block copolymer.

In still another embodiment, the method includes step of II) reacting the organosiloxane block copolymer from step I), e.g., to crosslink the trisiloxy units of the organosiloxane block copolymer and/or to increase the weight average molecular weight ($M_w$) of the organosiloxane block copolymer by at least 50%. A further embodiment includes the step of further processing the organosiloxane block copolymer to enhance storage stability and/or optical clarity and/or the optional step of removing the organic solvent.

The reaction of the first step may be represented generally according to the following schematic:

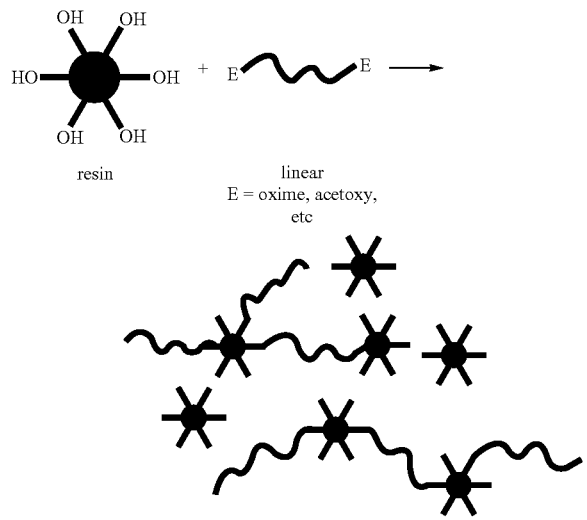

wherein various OH groups (i.e., SiOH groups) on the organosiloxane resin may be reacted with the hydrolyzable groups (E) on the linear organosiloxane, to form the organosiloxane block copolymer and an H-(E) compound. The reaction in step I may be described as a condensation reaction between the organosiloxane resin and the linear organosiloxane.

the (a) Linear Organosiloxane:

Component a) in step I of the present process is a linear organosiloxane having the formula $R^1_q(E)_{(3-q)}SiO(R^1_2SiO_{2/2})_nSi(E)_{(3-q)}R^1_q$, where each $R^1$ is independently a $C_1$ to $C_{30}$ hydrocarbyl, the subscript "n" may be considered as the degree of polymerization (dp) of the linear organosiloxane and may vary from 10 to 400, the subscript "q" may be 0, 1, or 2, and E is a hydrolyzable group containing at least one carbon atom. While component a) is described as a linear organosiloxane having the formula $R^1(E)_{(3-q)}SiO(R^1_2SiO_{2/2})_nSi(E)_{(3-q)}R^1_q$, one skilled in the art recognizes small amount of alternative siloxy units, such a T ($R^1SiO_{3/2}$) siloxy units, may be incorporated into the linear organosiloxane and still be used as component a). As such, the organosiloxane may be considered as being "predominately" linear by having a majority of D ($R^1_2SiO_{2/2}$) siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

$R^1$ in the above linear organosiloxane formula is independently a $C_1$ to $C_{30}$ hydrocarbyl. The hydrocarbon group may independently be an alkyl, aryl, or alkylaryl group. As used herein, hydrocarbyl also includes halogen substituted hydrocarbyls, where the halogen may be chlorine, fluorine, bromine or combinations thereof. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

E may be selected from any hydrolyzable group containing at least one carbon atom. In some embodiments, E is selected from an oximo, epoxy, carboxy, amino, amido group or combinations thereof. Alternatively, E may have the formula $R^1C(=O)O-$, $R^1_2C=N-O-$, or $R^4C=N-O-$, where $R^1$ is as defined above, and $R^4$ is hydrocarbyl. In one embodiment, E is $H_3CC(=O)O$-(acetoxy) and q is 1. In one embodiment, E is $(CH_3)(CH_3CH_2)C=N-O$-(methylethylketoxy) and q is 1.

In one embodiment, the linear organosiloxane has the formula $(CH_3)_q(E)_{(3-q)}SiO[(CH_3)_2SiO_{2/2}]_nSi(E)_{(3-q)}(CH_3)_q$, where E, n, and q are as defined above.

In one embodiment, the linear organosiloxane has the formula $(CH_3)_q(E)_{(3-q)}SiO[(CH_3)(C_6H_5)SiO_{2/2}]_nSi(E)_{(3-q)}(CH_3)_q$, where E, n, and q are as defined above.

Processes for preparing linear organosiloxanes suitable as component a) are known. In some embodiments, a silanol terminated polydiorganosiloxane is reacted with an "endblocking" compound such as an alkyltriacetoxysilane or a dialkylketoxime. The stoichiometry of the endblocking reaction is typically adjusted such that a sufficient amount of the endblocking compound is added to react with all the silanol groups on the polydiorganosiloxane. Typically, a mole of the endblocking compound is used per mole of silanol on the polydiorganosiloxane. Alternatively, a slight molar excess such as 1 to 10% of the endblocking compound may be used. The reaction is typically conducted under anhydrous conditions to minimize condensation reactions of the silanol polydiorganosiloxane. Typically, the silanol ended polydiorganosiloxane and the endblocking compound are dissolved in an organic solvent under anhydrous conditions, and allowed to react at room temperature, or at elevated temperatures (e.g., up to the boiling point of the solvent).

The (b) Organosiloxane Resin:

Component b) in the present process is an organosiloxane resin comprising at least 60 mole % of $[R^2SiO_{3/2}]$ siloxy units in its formula, where each $R^2$ is independently a $C_1$ to $C_{20}$ hydrocarbyl. As used herein, hydrocarbyl also includes halogen substituted hydrocarbyls, where the halogen may be chlorine, fluorine, bromine or combinations thereof. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The organosiloxane resin may contain any amount and combination of other M, D, and Q siloxy units, provided the organosiloxane resin contains at least 70 mole % of $[R^2SiO_{3/2}]$ siloxy units, alternatively the organosiloxane resin contains at least 80 mole % of $[R^2SiO_{3/2}]$ siloxy units, alternatively the organosiloxane resin contains at least 90 mole % of $[R^2SiO_{3/2}]$ siloxy units, or alternatively the organosiloxane resin contains at least 95 mole % of $[R^2SiO_{3/2}]$ siloxy units. In some embodiments, the organosiloxane resin contains from about 70 to about 100 mole % of $[R^2SiO_{3/2}]$ siloxy units, e.g., from about 70 to about 95 mole % of $[R^2SiO_{3/2}]$ siloxy units, from about 80 to about 95 mole % of $[R^2SiO_{3/2}]$ siloxy units or from about 90 to about 95 mole % of [R²SiO₃/₂] siloxy units. Organosiloxane resins useful as component b) include those known as "silsesquioxane" resins.

The weight average molecular weight ($M_w$) of the organosiloxane resin is not limiting, but, in some embodiments, ranges from 1000 to 10,000, or alternatively 1500 to 5000 g/mole.

One skilled in the art recognizes that organosiloxane resins containing such high amounts of [R²SiO₃/₂] siloxy units will inherently have a certain concentration of Si—OZ where Z may be hydrogen (i.e., silanol), an alkyl group (so that OZ is an alkoxy group), or alternatively OZ may also be any of the "E" hydrolyzable groups as described above. The Si—OZ content as a mole percentage of all siloxy groups present on the organosiloxane resin may be readily determined by ²⁹Si NMR. The concentration of the OZ groups present on the organosiloxane resin will vary, as dependent on the mode of preparation, and subsequent treatment of the resin. In some embodiments, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

Organosiloxane resins containing at least 60 mole % of [R²SiO₃/₂] siloxy units, and methods for preparing them, are known in the art. They are typically prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

One skilled in the art further recognizes that organosiloxane resins containing such high amounts of [R²SiO₃/₂] siloxy units and silanol contents may also retain water molecules, especially in high humidity conditions. Thus, it is often beneficial to remove excess water present on the resin by "drying" the organosiloxane resin prior to reacting in step I. This may be achieved by dissolving the organosiloxane resin in an organic solvent, heating to reflux, and removing water by separation techniques (for example Dean Stark trap or equivalent process).

The amounts of a) and b) used in the reaction of step I are selected to provide the resin-linear organosiloxane block copolymer with 40 to 90 mole % of disiloxy units [R¹₂SiO₂/₂] and 10 to 60 mole % of trisiloxy units [R²SiO₃/₂]. The mole % of dilsiloxy and trisiloxy units present in components a) and b) may be readily determined using ²⁹Si NMR techniques. The starting mole % then determines the mass amounts of components a) and b) used in step I.

In some embodiments, the organosiloxane block copolymers comprise 40 to 90 mole percent disiloxy units of the formula [R¹₂SiO₂/₂], e.g., 50 to 90 mole percent disiloxy units of the formula [R¹₂SiO₂/₂]; 60 to 90 mole percent disiloxy units of the formula [R¹₂SiO₂/₂]; 65 to 90 mole percent disiloxy units of the formula [R¹₂SiO₂/₂]; 70 to 90 mole percent disiloxy units of the formula [R¹₂SiO₂/₂]; or 80 to 90 mole percent disiloxy units of the formula [R¹₂SiO₂/₂]; 40 to 80 mole percent disiloxy units of the formula [R¹₂SiO₂/₂]; 40 to 70 mole percent disiloxy units of the formula [R¹₂SiO₂/₂]; 40 to 60 mole percent disiloxy units of the formula [R¹₂SiO₂/₂]; 40 to 50 mole percent disiloxy units of the formula [R¹₂SiO₂/₂]; 50 to 80 mole percent disiloxy units of the formula [R¹₂SiO₂/₂]; 50 to 70 mole percent disiloxy units of the formula [R¹₂SiO₂/₂]; 50 to 60 mole percent disiloxy units of the formula [R¹₂SiO₂/₂]; 60 to 80 mole percent disiloxy units of the formula [R¹₂SiO₂/₂]; 60 to 70 mole percent disiloxy units of the formula [R¹₂SiO₂/₂]; or 70 to 80 mole percent disiloxy units of the formula [R¹₂SiO₂/₂].

In some embodiments, the organosiloxane block copolymers comprise 10 to 60 mole percent trisiloxy units of the formula [R²SiO₃/₂], e.g., 10 to 20 mole percent trisiloxy units of the formula [R²SiO₃/₂]; 10 to 30 mole percent trisiloxy units of the formula [R²SiO₃/₂]; 10 to 35 mole percent trisiloxy units of the formula [R²SiO₃/₂]; 10 to 40 mole percent trisiloxy units of the formula [R²SiO₃/₂]; 10 to 50 mole percent trisiloxy units of the formula [R²SiO₃/₂]; 20 to 30 mole percent trisiloxy units of the formula [R²SiO₃/₂]; 20 to 35 mole percent trisiloxy units of the formula [R²SiO₃/₂]; 20 to 40 mole percent trisiloxy units of the formula [R²SiO₃/₂]; 20 to 50 mole percent trisiloxy units of the formula [R²SiO₃/₂]; 20 to 60 mole percent trisiloxy units of the formula [R²SiO₃/₂]; 30 to 40 mole percent trisiloxy units of the formula [R²SiO₃/₂]; 30 to 50 mole percent trisiloxy units of the formula [R²SiO₃/₂]; 30 to 60 mole percent trisiloxy units of the formula [R²SiO₃/₂]; 40 to 50 mole percent trisiloxy units of the formula [R²SiO₃/₂]; or 40 to 60 mole percent trisiloxy units of the formula [R²SiO₃/₂].

The amount of components a) and b) selected may also create a molar excess of the silanol groups on the organosiloxane resin vs. amount of linear organosiloxane added. Thus, a sufficient amount of the organosiloxane resin may be added to potentially react with all the linear organosiloxane added in step I). As such, a molar excess of the organosiloxane resin is used. The amounts used may be determined by accounting for the moles of the organosiloxane resin used per mole of the linear organosiloxane.

As discussed above, the reaction affected in step I is a condensation reaction between the hydrolyzable groups of linear organosiloxane with the silanol groups on the organosiloxane resin. A sufficient amount of silanol groups needs to remain on the resin component of the formed resin-linear organosiloxane copolymer to further react in step II of the present process. In some embodiments, at least 10 mole %, alternatively at least 20 mole %, or alternatively at least 30 mole % silanol may remain on the trisiloxy units of the resin-linear organosiloxane copolymer as produced in step I of the present process. In some embodiments, from about 10 mole % to about 60 mole %, e.g., from about 20 mole % to about 60 mole %, or from about 30 mole % to about 60 mole %, may remain on the trisiloxy units of the resin-linear organosiloxane copolymer as produced in step I of the present process.

The reaction conditions for reacting the aforementioned (a) linear organosiloxane with the (b) organosiloxane resin are not limited. In some embodiments, reaction conditions are selected to effect a condensation type reaction between the a) linear organosiloxane and b) organosiloxane resin. Various non-limiting embodiments and reaction conditions are described in the Examples below. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. Typically, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar. Typically, aromatic solvents such as toluene, xylene, benzene, and the like are utilized. The amount of the organosiloxane resin dissolved in the organic solvent may vary, but the amount may be selected to minimize the chain extension of the linear organosiloxane or pre-mature condensation of the organosiloxane resin.

The order of addition of components a) and b) may vary. In some embodiments, the linear organosiloxane is added to a solution of the organosiloxane resin dissolved in the organic solvent. This order of addition is believed to enhance the condensation of the hydrolyzable groups on the linear organosiloxane with the silanol groups on organosiloxane resin, while minimizing chain extension of the linear organosiloxane or pre-mature condensation of the organosiloxane resin. In other embodiments, the organosiloxane resin is added to a solution of the linear organosiloxane dissolved in the organic solvent.

The progress of the reaction in step I, and the formation of the resin-linear organosiloxane block copolymer, may be monitored by various analytical techniques, such as GPC, IR, or $^{29}$Si NMR. Typically, the reaction in step I is allowed to continue until at least 95 weight percent (e.g., at least 96%, at least 97%, at least 98%, at least 99% or 100%) of the linear organosiloxane added in step I is incorporated into the resin-linear organosiloxane block copolymer.

The second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%. In some embodiments, the second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer from about 50% to about 100%, e.g., from about 60% to about 100%, from about 70% to about 100%, from about 80% to about 100% or from about 90% to about 100%.

The reaction of the second step of the method may be represented generally according to the following schematic:

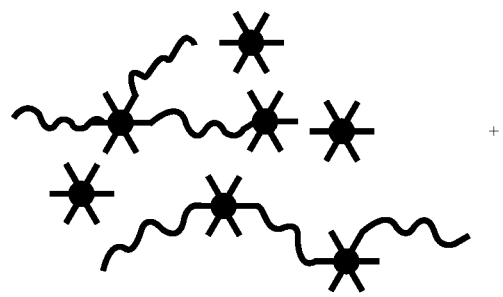

+

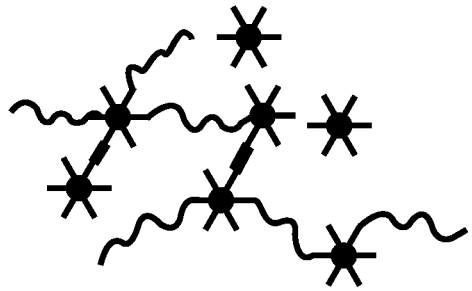

n/a (oxime), acetoxy-silane, ...

It is believed that reaction of step II crosslinks the trisiloxy blocks of the resin-linear organosiloxane block copolymer formed in step I, which will increase the average molecular weight of the block copolymer. The inventors also believe the crosslinking of the trisiloxy blocks provides the block copolymer with an aggregated concentration of trisiloxy blocks, which ultimately may help to form "nano-domains" in solid compositions of the block copolymer. In other words, this aggregated concentration of trisiloxy blocks may phase separate when the block copolymer is isolated in a solid form such as a film or cured coating. The aggregated concentration of trisiloxy block within the block copolymer and subsequent formation of "nano-domains" in the solid compositions containing the block copolymer, may provide for enhanced optical clarity of these compositions as well as the other physical property benefits associated with these materials.

The crosslinking reaction in Step II may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin in step I of the preparation of the block copolymer. The free resin component may crosslink with the non-linear blocks by condensation of the residual silanol groups present on the non-linear blocks and on the free resin. The free resin may provide crosslinking by reacting with lower molecular weight compounds added as crosslinkers, as described below.

Step II of the present process may occur simultaneous upon formation of the resin-linear organosiloxane of step I, or involve a separate reaction in which conditions have been modified to affect the step II reaction.

The step II reaction may occur in the same conditions as step I. In this situation, the step II reaction proceeds as the resin-linear organosiloxane copolymer is formed. Alternatively, the reaction conditions used for step I) are extended to further the step II reaction. Alternatively, the reaction conditions may be changed, or additional ingredients added to affect the step II reaction.

In some embodiments, the step II reaction conditions may depend on the selection of the hydrolyzable group (E) used in the starting linear organosiloxane. When (E) in the linear organosiloxane is an oxime group, it is possible for the step II reaction to occur under the same reaction conditions as step I.

That is, as the linear-resin organosiloxane copolymer is formed in step I, it will continue to react via condensation of the silanol groups present on the resin component to further increase the molecular weight of the resin-linear organosiloxane copolymer. Not wishing to be bound by any theory, it is believed that when (E) is an oximo group, the hydrolyzed oximo group (for example methyl ethylketoxime) resulting from the reaction in step I may act as a condensation catalyst for the step II reaction. As such, the step II reaction may proceed simultaneously under the same conditions for step I. In other words, as the resin-linear organosiloxane copolymer is formed in step I, it may further react under the same reaction conditions to further increase its molecular weight via a condensation reaction of the silanol groups present on the resin component of the copolymer. However, when (E) on the linear organosiloxane is an acetoxy group, the resulting hydrolyzed group (acetic acid), does not sufficiently catalyze the step II) reaction. Thus, in this situation the step II reaction may be enhanced with a further component to affect condensation of the resin components of the resin-linear organosiloxane copolymer, as described in the embodiment below.

In one embodiment of the present process, an organosilane having the formula $R^5_q SiX_{4-q}$ is added during step II), where $R^5$ is a $C_1$ to $C_8$ hydrocarbyl or a $C_1$ to $C_8$ halogen-substituted hydrocarbyl, X is a hydrolyzable group, and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be E, as defined above, a halogen atom, hydroxyl (OH), or an alkoxy group. In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in this embodiment include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketo xime) silane.

The amount of organosilane having the formula $R^5_q SiX_{4-q}$ when added during step II) may vary, but may be based on the amount of organosiloxane resin used in the process. The amount of silane used may provide a molar stoichiometry of 2 to 15 mole % of organosilane per moles of Si on the organosiloxane resin. Furthermore, the amount of the organosilane having the formula $R^5_q SiX_{4-q}$ added during step II) is controlled to ensure a stoichiometry that does not consume all the silanol groups on the organosiloxane block copolymer. In one embodiment, the amount of the organosilane added in step II is selected to provide an organosiloxane block copolymer containing 0.5 to 35 mole percent of silanol groups [≡SiOH].

Step III in the present method is optional, and includes further processing the organosiloxane block copolymer formed using the aforementioned method steps to enhance storage stability and/or optical clarity. As used herein the phrase "further processing" describes any further reaction or treatment of the organosiloxane block copolymer to enhance storage stability and/or optical clarity. The organosiloxane block copolymer as produced in step I may include an amount of reactive "OZ" groups (e.g. ≡SiOZ groups, where Z is as described above), and/or X groups (where X is introduced into the organosiloxane block copolymer when the organosilane having the formula $R^5_q SiX_{4-q}$ is used in step II). The OZ groups present on the organosiloxane block copolymer at this stage may be silanol groups that were originally present on the resin component, or alternatively may result from the reaction of the organosilane having the formula $R^5_q SiX_{4-q}$ with silanol groups, when the organosilane is used in step II. Alternatively, further reaction of residual silanol groups may further enhance the formation of the resin domains and improve the optical clarity of the organosiloxane block copolymer. Thus, optional step III may be performed to further react OZ or X present on the organosiloxane block copolymer produced in Step II to improve storage stability and/or optical clarity. The conditions for step III may vary, depending on the selection of the linear and resin components, their amounts, and the endcapping compounds used.

In one embodiment of the method, step III is performed by reacting the organosiloxane block copolymer from step II with water and removing any small molecular compounds formed in the method such as acetic acid. In this embodiment, the organosiloxane block copolymer is typically produced from a linear organosiloxane where E is an acetoxy group, and/or an acetoxy silane is used in step II. Although not wishing to be bound by any theory, the organosiloxane block copolymer formed in step II may include a quantity of hydrolyzable Si—O—C(O)CH$_3$ groups, which may limit the storage stability of the organosiloxane block copolymer. Thus, water may be added to the organosiloxane block copolymer formed from step II, which may hydrolyze Si—O—C(O)CH$_3$ groups to further link the trisiloxy units, and eliminate acetic acid. The formed acetic acid, and any excess water, may be removed by known separation techniques. The amount of water added in this embodiment may vary, but typically is 10 weight %, or alternatively 5 weight % is added per total solids (as based on organosiloxane block copolymer in the reaction medium).

In another embodiment of the method, step III is performed by reacting the organosiloxane block copolymer from step II with an endcapping compound chosen from an alcohol, oxime, or trialkylsiloxy compound. In this embodiment, the organosiloxane block copolymer is typically produced from a linear organosiloxane where E is an oxime group. The endcapping compound may be a $C_1$-$C_{20}$ alcohol such as methanol, ethanol, propanol, butanol, or others in the series. Alternatively, the alcohol is n-butanol. The endcapping compound may also be a trialkylsiloxy compound, such as trimethylmethoxysilane or trimethylethoxysilane. The amount of endcapping compound may vary but typically is between 3 and 15 wt % with respect to the organosiloxane block copolymer.

In some embodiments, step III includes adding to the resin-linear organosiloxane block copolymer from step II) a superbase catalyst or a stabilizer. The superbase catalyst and stabilizer amounts used in step III are the same as described above.

Step IV of the present process is optional, and involves removing the organic solvent used in the reactions of steps I and II. The organic solvent may be removed by any known techniques, but typically involves heating the resin-linear organosiloxane copolymer compositions at elevated temperature, either at atmospheric conditions or under reduced pressures. In some embodiments, not all of the solvent is removed. In this embodiment, at least 20%, at least 30%, at least 40%, or at least 50% of the solvent is removed, e.g., at least 60%, at least 70%, at least 75%, at least 80% or at least 90% of the solvent is removed. In some embodiments, less than 20% of the solvent is removed, e.g., less than 15%, less than 10%, less than 5% or 0% of the solvent is removed. In other embodiments, from about 20% to about 100% of the solvent is removed, e.g., from about 30% to about 90%, from about 20% to about 80%, from about 30 to about 60%, from about 50 to about 60%, from about 70 to about 80% or from about 50% to about 90% of the solvent is removed.

In additional non-limiting embodiments, this disclosure includes one or more elements, components, method steps, test methods, etc., as described in one or more of Published PCT Appl. Nos. WO2012/040302; WO2012/040305; WO2012/040367; WO2012/040453; and WO2012/040457, all of which are expressly incorporated herein by reference.

Method of Forming a Curable Silicone Composition:

A curable silicone composition may be formed using a method that includes the step of combining the solid composition and a solvent, as described above. The method may also include one or more steps of introducing and/or combining additional components, such as the organosiloxane resin and/or cure catalyst to one or both of the solid composition and the solvent. A solid composition and the solvent may be combined with each other and/or any other components using any method known in the art such as stirring, vortexing, mixing, etc.

Method of Forming an Optical Assembly:

This disclosure also provides a method of forming optical assembly. In some embodiments, the method includes the step of combining a light emitting diode and a solid composition of some of the embodiments described herein to form the optical assembly. The step of combining is not particularly limited and may be include, or be further defined as, disposing the light emitting diode and a solid composition of some of the embodiments described herein next to each other; on top of each other; and/or in direct or in indirect contact with each other. For example, a solid composition may be disposed on the light emitting diode such that it is and in direct contact with the light emitting diode. Alternatively, the solid composition may be disposed on, but separated from and not in direct contact with, the light emitting diode, yet may still be disposed on the light emitting diode. In other words, although solid composition may be layered or "disposed on" the LED, it should be understood that, in some embodiments, there could be one or more layers separating the solid composition from the LED.

The solid composition may be heated to flow, melted, pressed, (vacuum) laminated, compression molded, injection transfer molded, calendared, hot-embossed, injection molded, extruded, or any other process step that changes the solid composition from a solid to a liquid or to a softened solid.

The liquid or softened solid composition may then be applied to the light emitting diode by any one or more of the aforementioned techniques, via spraying, ink-jet printing, pouring, painting, coating, dipping, brushing, or the like.

In one embodiment, the step of combining is further defined as melting the solid composition such that the solid composition is disposed on and in direct contact with the light emitting diode. In another embodiment, the step of combining is further defined as melting the solid composition such that the solid composition is disposed on and in indirect contact with the light emitting diode. In still another embodiment, the method further includes the step of providing a solution of the solid composition in a solvent, e.g., dissolved or partially dissolved in the solvent. In an even further embodiment, the method includes the step of removing the solvent to form the solid composition prior to the step of combining the light emitting diode and the solid composition. In still another embodiment, the method further includes the step of forming the solid composition into a sheet subsequent to the step of removing the solvent and prior to the step of combining the light emitting diode and the solid composition.

In other embodiments, the method includes the step of curing the solid composition by methods known in the art, including, e.g. via a condensation reaction, a free radical reaction, or a hydrosilylation reaction. It is contemplated that any catalysts, additives, and the like may be utilized in the step of curing. For example, acidic or basic condensation catalysts may be utilized. Alternatively, hydrosilylation catalysts, such as platinum catalysts, may be utilized. In one embodiment, the step of curing occurs at a temperature higher than the melting temperature of the solid composition. Alternatively, the step of curing may occur at approximately the melting temperature, or below the melting temperature, of the solid composition.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt. %. All measurements were conducted at 23° C. unless indicated otherwise.

Characterization Techniques $^{29}$Si and $^{13}$C NMR Spectrometry

NMR samples of resin linear compositions were prepared by weighing ~3 grams of solvent free resin linear (prepared by drying sample overnight at room temperature), 1 g of $CDCl_3$, and 4 grams of 0.04 M $Cr(acac)_3$ solution in $CDCl_3$ into a vial and mixing thoroughly Samples were then transferred into a silicon-free NMR tube. Spectra were acquired using a Varian Mercury 400 MHz NMR. NMR samples of other materials such as 217 Flake and silanol terminated PDMS were prepared by diluting 4 g of sample into 4 grams of 0.04 M $Cr(acac)_3$ solution in $CDCl_3$.

$^{13}$C NMR experiments were performed in the following manner. Samples were placed into 16 mm glass NMR tubes. A 5 mm NMR tube was placed inside the 16 mm tube and filled with lock solvent. 13C DEPT NMR was acquired in 12 or 20 minute signal averaging blocks. Data was acquired on a Varian Inova NMR spectrometer with a $^1$H operational frequency of 400 MHz.

Silanol content of resin linear products was calculated from the integration values of the T(Ph,OZ) and T(Ph,OZ2) regions in the $^{29}$Si NMR spectrum. T(Alkyl) groups were considered fully condensed (assumption) and subtracted from the T(Ph,OZ) region. The T(Alkyl) content was calculated by multiplying the integration value of $D(Me_2)$ from $^{29}$Si NMR by the fraction (moles Si of coupling agent/moles Si of PDMS used in the synthesis formulation). Isopropoxy from 217 Flake was not subtracted out of the OZ values due to its low concentration. Therefore it was assumed that total OZ=total OH.

GPC Analysis

Samples were prepared in certified THF at 0.5% w/v concentration, filtered with a 0.45 µm PTFE syringe filter, and analyzed against polystyrene standards. The relative calibration ($3^{rd}$ order fit) used for molecular weight determination was based on 16 polystyrene standards ranging in molecular weights from 580 to 2,320,000 Daltons. The chromatographic equipment consisted of a Waters 2695 Separations Module equipped with a vacuum degasser, a Waters 2410 differential refractometer and two (300 mm×7.5 mm) Polymer Laboratories Mixed C columns (molecular weight separation range of 200 to 3,000,000) preceded by a guard column. The separation was performed using certified grade THF programmed to flow at 1.0 mL/min., injection volume was set at 100 µL and columns and detector were heated to 35° C. Data collection was 25 minutes and processing was performed using Atlas/Cirrus software.

To determine free resin content, the free resin peak at lower molecular weight was integrated to get the area percent.

Rheology Analysis

A commercially available rheometer from TA Instruments (ARES-RDA with 2KSTD standard flexular pivot spring transducer, TA Instruments, New Castle, Del. 19720) with forced convection oven was used to measure the storage modulus (G'), loss modulus (G") and tan delta as a function of temperature. Test specimens (typically 8 mm wide, 1 mm thick) were loaded in between parallel plates and measured using small strain oscillatory rheology while ramping the temperature in a range from 25° C. to 300° C. at 2° C./min (frequency 1 Hz).

To characterize the copolymers, the flow onset was calculated as the inflection temperature in the G' drop (labeled FLOW), the viscosity at 120° C. will be reported as a measure for melt processability and the cure onset was calculated as the inflection temperature in the G' rise (labeled CURE).

Tear Strength

Tear strengths were evaluated according to ASTM D624. Specimens were die cut from cured films typically measuring 1-2 mm in thickness. If testing Type B or Type C geometries three specimens were utilized. If testing type T (trouser), one to three specimens were prepared depending on the amount of sample film available. Before testing no special storage considerations were taken as the materials were not expected to be significantly affected by small changes in temperature or humidity. Specimens were tested at ambient temperature and humidity with an Instron universal test machine utilizing Bluehill 2 software. For type B and C specimens the test speed used was 500 mm/min and specimens were pulled to failure. Median peak force/thickness was reported. For type T (trouser) specimens a pulling speed of 50 mm/min was used and specimens were pulled until the tear force was seen to level off or until failure occurred. After testing the beginning and ending points of the level region of the force curve were identified visually. Then the analyzing function of the software was used to calculate the average tear force/thickness within the identified region. If more than one specimen was tested the median reading was reported.

Optical Clarity

Optical clarity was evaluated as the % transmission of light at wavelengths from about 350-1000 nanometers, measured through 1 mm thick samples of cast sheets of the present compositions. Samples having a % transmittance of at least 95% were considered to be optically clear.

Example 1

A 500 mL 4-neck round bottom flask is loaded with toluene (65.0 g) and Phenyl-T Resin (FW=136.6 g/mole Si; 35.0 g, 0.256 moles Si). The flask is equipped with a thermometer, Teflon stir paddle, and a Dean Stark apparatus prefilled with toluene and attached to a water-cooled condenser. A nitrogen blanket is then applied. An oil bath is used to heat the flask at reflux for 30 minutes. Subsequently, the flask is cooled to about 108° C. (pot temperature).

A solution of toluene (35.0 g) and silanol terminated PhMe siloxane (140 dp, FW=136.3 g/mole Si, 1.24 mole % SiOH, 65.0 g, 0.477 moles Si) is then prepared and the siloxane is capped with 50/50 methyl triacetoxy silane (MTA)/ethyl triacetoxy silane (ETA) (Avg. FW=231.2 g/mole Si, 1.44 g, 0.00623 moles) in a glove box (same day) under nitrogen by adding 50/50 MTA/ETA to the siloxane and mixing at room temperature for 2 hours. The capped siloxane is then added to the Phenyl-T Resin/toluene solution at 108° C. and refluxed for about 2 hours.

After reflux, the solution is cooled back to about 108° C. and an additional amount of 50/50 MTA/ETA (Avg. FW=231.2 g/mole Si, 6.21 g, 0.0269 moles) is added and the solution is then refluxed for an additional hour.

Subsequently, the solution is cooled to 90° C. and then 12 mL of DI water is added. The solution including the water is then heated to reflux for about 1.5 hours to remove the water via azeotropic distillation. The addition of water and subsequent reflux is then repeated. A total amount of aqueous phase removed is about 27.3 g.

Subsequently, some toluene (about 54.0 g) along with most residual acetic acid is then distilled off (for about 20 minutes) to increase the solids content.

The solution is then cooled to room temperature and the solution is pressure filtered through a 5.0 µm filter to isolate the solid composition.

The solid composition is analyzed by $^{29}$Si NMR which confirms a structure of $D^{PhMe}_{0.635}T^{Alkyl}_{0.044}T^{Cyclohexyl}_{0.004}T^{Ph}_{0.317}$ with an OZ of about 11.8 mole %.

Example 2

A 2 L 3-neck round bottom flask is loaded with toluene (544.0 g) and 216.0 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (176.0 g) and 264.0 g of the silanol terminated PhMe siloxane described above is prepared and the siloxane is capped with 50/50 MTA/ETA (4.84 g, 0.0209 moles Si) in a glove box (same day) under nitrogen by adding the MTA/ETA to the siloxane and mixing at room temperature for 2 hrs, as also described above.

The capped siloxane is then added to the Phenyl-T Resin/toluene solution at 108° C. and refluxed for about 2 hours.

After reflux, the solution is cooled back to about 108° C. and an additional amount of 50/50 MTA/ETA (38.32 g, 0.166 moles Si) is added and the solution is then refluxed for an additional 2 hours.

Subsequently, the solution is cooled to 90° C. and then 33.63 g of DI water is added.

The solution including the water is then heated to reflux for about 2 hours to remove the water via azeotropic distillation. The solution is then heated at reflux for 3 hrs. Subsequently, the solution is cooled to 100° C. and then pre-dried Darco G60 carbon black (4.80 g) is added thereto.

The solution is then cooled to room temperature with stirring and then stirred overnight at room temperature. The solution is then pressure filtered through a 0.45 μm filter to isolate the solid composition.

The solid composition is analyzed by $^{29}$Si NMR which confirms a structure of $D^{PhMe}_{0.519}T^{Alkyl}_{0.050}T^{Ph}_{0.431}$ with an OZ of about 22.2 mole %. No acetic acid is detected in the solid composition using FT-IR analysis.

Example 3

A 500 mL 3-neck round bottom flask is loaded with toluene (86.4 g)+ and 33.0 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (25.0 g) and 27.0 g of the silanol terminated PhMe siloxane described above is prepared and the siloxane is capped with Methyl tris(methylethylketoxime)silane ((MTO); MW=301.46) in a glove box (same day) under nitrogen by adding the MTA/ETA to the siloxane and mixing at room temperature for 2 hrs, as also described above.

The capped siloxane is then added to the Phenyl-T Resin/toluene solution at 108° C. and refluxed for about 3 hours. As described in greater detail below, films are then cast from this solution. The organosiloxane block copolymer in the solution is analyzed by $^{29}$Si NMR which confirms a structure of $D^{PhMe}_{0.440}T^{Me}_{0.008}T^{Ph}0.552$ with an OZ of about 17.0 mole %. No acetic acid is detected in the solid composition using FT-IR analysis.

Example 4

A 5 L 4-neck round bottom flask is loaded with toluene (1000.0 g) and 280.2 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (500.0 g) and 720.0 g of a silanol terminated PDMS (FW=74.3 g/mole Si; ~1.01 mole % OH) is prepared and the PDMS is capped with 50/50 MTA/ETA (23.77 g, 0.1028 moles Si) in a glove box (same day) under nitrogen by adding the MTA/ETA to the siloxane and mixing at room temperature for 30 minutes, as also described above.

The capped PDMS is then added to the Phenyl-T Resin/toluene solution at 108° C. and refluxed for about 3 hours fifteen minutes.

After reflux, the solution is cooled back to about 108° C. and an additional amount of 50/50 MTA/ETA (22.63 g, 0.0979 moles Si) is added and the solution is then refluxed for an additional 1 hour.

Subsequently, the solution is cooled to 100° C. and then 36.1 g of DI water is added.

The solution including the water is then heated at 88-90° C. for about 30 minutes and then heated at reflux for about 1.75 hours to remove about 39.6 grams of water via azeotropic distillation. The solution is then left overnight to cool.

Subsequently, the solution heated to reflux for 2 hours and then allowed to cool to 100° C. To reduce the acetic acid level, 126.8 g of DI water is then added and azeotropically removed over a 3.25 hr time period. The amount removed from the Dean Stark apparatus is about 137.3 g. The solution is then cooled to 100° C. Subsequently, 162.8 g of water is then added and then azeotropically removed over a 4.75 hr time period. The amount removed from the Dean Stark apparatus is about 170.7 g. The solution is then cooled to 90° C. and 10 g of Darco G60 carbon black is added thereto. The solution is then cooled to room temperature with stirring and then allowed to stir overnight at room temperature.

The solution is then pressure filtered through a 0.45 μm filter to isolate the solid composition.

The solid composition is analyzed by $^{29}$Si NMR which confirms a structure of $D^{Me2}_{0.815}T^{Alkyl}_{0.017}T^{Ph}_{0.168}$ with an OZ of about 6.56 mole %. No acetic acid is detected in the solid composition using FT-IR analysis.

Example 5

A 12 L 3-neck round bottom flask is loaded with toluene (3803.9 g) and 942.5 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (1344 g) and 1829.0 g of the silanol terminated PDMS described immediately above is prepared and the PDMS is capped with MTO (methyl tris(methylethylketoxime)silane (85.0 g, 0.2820 moles Si)) in a glove box (same day) under nitrogen by adding the MTO to the siloxane and mixing at room temperature for 2 hours, as also described above.

The capped PDMS is then added to the Phenyl-T Resin/toluene solution at 110° C. and refluxed for about 2 hours ten minutes. Subsequently, 276.0 g of n-butanol is added and the solution is then refluxed for 3 hours and then allowed to cool to room temperature overnight.

Subsequently, about 2913 g of toluene is removed by distillation to increase a solids content to ~50 weight %. A vacuum is then applied at 65-75° C. for ~2.5 hrs. Then, the solution is filtered through a 5.0 μm filter after setting for 3 days to isolate the solid composition.

The solid composition is analyzed by $^{29}$Si NMR which confirms a structure of $D^{Me2}_{0.774}T^{Me}_{0.009}T^{Ph}_{0.217}$ with an OZ of about 6.23 mole %. No acetic acid is detected in the solid composition using FT-IR analysis.

Example 6

A 1 L 3neck round bottom flask is loaded with toluene (180.0 g) and 64.9 g of the Phenyl-T resin described. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (85.88 g) and 115.4 g of the silanol terminated PDMS is prepared and the PDMS is capped with 50/50 MTA/ETA in a glove box (same day) under nitrogen by adding MTA/ETA/toluene (8.25 g, 0.0177 moles Si) to the silanol terminated PDMS and mixing at room temperature for 2 hours.

The capped PDMS is then added to the Phenyl-T Resin/toluene solution at 108° C. and refluxed for about 2 hours.

Subsequently, the solution is cooled back to 108° C. and an additional amount of the MTA/ETA (15.94 g, 0.0343 moles Si) is added. The solution is then heated at reflux for one hour and then cooled back to 108° C. An additional amount of the MTA/ETA/toluene (2.23 g, 0.0048 moles Si) is then added and the solution is again heated at reflux for one hour Subsequently, the solution is cooled to 100° C. and 30 mL of DI water is added. The solution is again heated to reflux to remove water via azeotropic distillation. This process is repeated 3×.

Then, the solution is heated and ~30 g of solvent is distilled off to increase the solids content. The solution is then cooled to room temperature and filtered through a 5.0 μm filter to isolate the solid composition.

The solid composition is analyzed by $^{29}$Si NMR which confirms a structure of $Me^2_{0.751}T^{Alkyl}_{0.028}T^P_{0.221}$ with an OZ of about 7.71 mole %. No acetic acid is detected in the solid composition using FT-IR analysis.

Comparative Example 1

A 1 L 3-neck round bottom Intended Morton Type flask with a bottom drain is loaded with DI water (196.1 g). The flask is equipped with a thermometer, Teflon stir paddle, and a water-cooled condenser. An addition funnel is loaded with $PhSiCl_3$ (82.95 g) and $PhMeSiCl_2$ (58.87 g) and toluene (142.65 g). This solution is added to the flask slowly starting at room temperature. Upon addition to the flask, the solution exotherms to 78° C. The solution is mixed for 15 min. Subsequently, the aqueous phase is removed and HCl is removed by water washing.

Then 25 mL DI water is added to the solution and the solution is heated at 80° C. for 15 min. The aqueous phase is then removed and the solution is then heated to reflux and additional water is removed via azeotropic distillation. These steps are repeated several times.

Subsequently, the solution is heated to distill solvent and to increase the solids content. The product is then stripped to dryness using a rotavapor at an oil bath temperature of 120° C. and ~0.5 mm Hg and filtered to isolate the product.

The product is analyzed by $^{29}$Si NMR which confirms a structure of $D^{PhMe}_{0.437}T^{Cyclohexyl}_{0.007}T^{Ph}_{0.556}$ with an OH content of about 44.5 mole % (5.55 wt %) and having a FW of about 136 g/mole.

Comparative Example 2

The components set forth below are mixed using a vacuum planetary mixer, Thinky ARV-310, for 2 minutes at 1600 rpm under 2 kPa to form a liquid composition.

Component 1: Average Unit Molecular Formula: $(Me_2ViSiO_{1/2})_{0.25}(PhSiO_{3/2})_{0.75}$; 5.8 g;

Component 2: Average Unit Molecular Formula: $Me_2ViSiO(MePhSiO)_{25}OSiMe_2Vi$; 1.8 g;

Component 3: Average Unit Molecular Formula: $HMe_2SiO(Ph_2SiO)SiMe_2H$, 2.0 g;

Component 4: Average Unit Molecular Formula: $(HMe_2SiO_{1/2})_{0.60}(PhSiO_{3/2})_{0.4}$; 0.24 g;

Component 5: Average Unit Molecular Formula: $(Me_2ViSiO_{1/2})_{0.18}(PhSiO_{3/2})_{0.54}(EpMeSiO)_{0.28}$ wherein (Ep=gricidoxypropyl); 0.23 g Component 6: Average Unit Molecular Formula: Cyclic $(ViSiMeO_{1/2})_n$; 0.02 g 1-Ethynyl-1-Cyclohexanol; 240 ppm Pt Catalyst (1,3-divinyltetramethylsiloxane complex); 2 ppm Comparative Example 3

Comparative Example 3 is prepared from the following using a vacuum planetary mixer:

Vinyldimethylsiloxy terminated polydimethylsiloxane (Average $M_w$=60,000); 42.9 parts Vinyldimethylsiloxy terminated polydimethylsiloxane (Average $M_w$=24,000); 14.5 parts Vinyldimethylsiloxy and trimethylsiloxy functional silica; 1.0 part Trimethylsiloxy functional silica; 5.7 parts 1,5-divinyl-1,1,5,5-tetramethyldisiloxane coordinated Platinum catalyst (Pt content 5 ppm for the total composition) $(Allylglycidoxypropyl-SiO_{3/2})_{0.5}(MeSiViO_{2/2})_{0.3}(Me_2SiO_{2/2})_{0.2}$; 11.7 parts After formation, Comparative Example 3 is casted on a polyethersulfone coated film and then heated at 100° C. for 3 minutes to form a film.

Evaluation of Example and Comparative Examples

After each of the aforementioned Examples are formed, various samples are evaluated to determine Modulus at 25° C., Shore A Hardness (cured), Melt Viscosity at 120° C., Trouser Tear, Tensile Strength, Elongation at Break, and Flexibility. The results of these evaluations are set forth in Table 1 below

TABLE 1

| Example | Modulus at 25° C. MPa | Shore A Hardness Cured | Melt Viscosity at 120° C., Pa · s | Trouser Tear kN/m | Tensile Strength MPa | Elongation at Break % | Flexibility |
|---|---|---|---|---|---|---|---|
| Example 1 | 121 | N/A | 71 | 1.8 | 6.66 | 121 | Excellent |
| Example 2 | 250 | 88 | 145 | 1.5 | 4.3 | 195 | Excellent |
| Example 3 | N/A | N/A | 422 | N/A | 8.5 | 26 | Good |
| Example 4 | 1.1 | 36 | 44,000 | 1.0 | 3.5 | 347 | Excellent |
| Example 5 | N/A | 56 | 32,000 | 3.4 | 1.5 | 195 | Excellent |
| Example 6 | 2.8 | 54 | 160,000 | <0.1 | 6.6 | 366 | Excellent |
| Comp. Ex. 1 | Too Brittle To Evaluate | N/A | N/A | N/A | Too Brittle To Evaluate | Too Brittle To Evaluate | Poor |
| Comp. Ex. 2 | 16.3 | 80 | N/A | N/A | 3 | 50 | Poor |
| Comp. Ex. 3 | 0.2 | 36 | N/A | N/A | 4.2 | 500 | Excellent |

Tear (ASTM D624) Specimens are die cut from sheets typically measuring 1-2 mm in thickness. Testing type T (trouser) three specimens are prepared depending on the amount of sample sheet available. Before testing no special storage considerations are taken as the sheets are not expected to be significantly affected by small changes in temperature or humidity. Specimens are tested at ambient temperature and humidity with an Instron universal test machine utilizing Bluehill 2 software. For type B and C specimens the test speed used is 500 mm/min and specimens are pulled to failure. Median peak force/thickness is reported. For type T (trouser) specimens a pulling speed of 50 mm/min is used and specimens are pulled until the tear force is seen to level off or until failure occurred. After testing the beginning and ending points of the level region of the force curve are identified visually. Then the analyzing function of the software is used to calculate the average tear force/thickness within the identified region. If more than one specimen was tested the median reading is reported.

Durometer (ASTM D2240) specimens approximately 6 mm thick are prepared by stacking together multiple pieces of sheets. Test equipment includes an analog Shore A durometer head mounted to an operating stand that both controlled the force and application speed. Three or five measurements are taken depending on size of specimen. Readings are taking after 1 sec of contact. Median readings are reported.

Tensile (ASTM D412) Specimens are die cut from sheets typically measuring 1-2 mm in thickness. Preferred specimen size is Type C, although smaller sizes can be cut so that three specimens can be obtained. Before testing no special storage considerations are taken as the sheets are not expected to be significantly affected by small changes in temperature or humidity. Specimens are tested at ambient temperature and humidity with an Instron universal test machine utilizing Bluehill 2 software. Test speed used is 500 mm/min, and specimens are pulled to failure. Median elongation and tensile strength, at both peak and breaking point, are reported along with Young's modulus. Raw stress-strain curves are also exported for further analysis and comparison with other materials.

Formation and Evaluation of Films and a Liquid:

After each of the aforementioned Examples are formed, 14.5 mg samples of Examples 2 and 4-6, along with Comparative Examples 2 and 3 are placed in an LED package and cured to form Solid State Lights 2 and 4-6 and Comparative Solid State Lights 2 and 3, respectively.

The LED package is TTI-5074 with BridgeLux's LED chip MK04545C, commercially available from Chiun Precision Industry.

Example 2 is cured via processing during pressing under 10N-30N of gradually increasing pressure and at temperatures increasing from 50-130° C., followed by 150° C./20 min and post baking at 160° C. for 3 h.

Examples 4-6 are each cured at 150° C. for 20 minutes pressing under 10N-30N of gradually increasing pressure followed by heating at 160° C. for 3 hours in an oven.

Comparative Example 2 is cured at 150° C. for 1 hour in an oven without any pressure.

Comparative Example 3 is cured at 150° C. for 1 hour in a press under 10N-30N of gradually increasing pressure but without use of any oven.

During or after formation of each Solid State Light, each Solid State Light is evaluated to determine Refractive Index, Wire Bending During Encapsulation, Reflow Stability (delamination), and Thermal Cycling Stability (# of Cycles Until Wire Opening).

TABLE 2

|  | Example/ Light 2 | Example/ Light 4 | Example/ Light 5 | Example/ Light 6 | Comp. Example/ Light 2 | Comp. Example/ Light 3 |
| --- | --- | --- | --- | --- | --- | --- |
| RI of Example After Curing | 1.56 | 1.44 | 1.45 | 1.45 | 1.54 | 1.41 |
| Wire bending During Encapsulation | No | Yes | No | Yes | No | Yes |
| Reflow stability (Delamination) | Excellent | Acceptable | Excellent | Acceptable | Poor | N/A |
| Thermal cycling stability (# cycles until wire opening) | Excellent >1000 | Excellent >1000 | Excellent >1000 | Excellent >1000 | Poor ~200 | N/A |

Refractive Index is determined by a prism coupling method with a 632.8 nm wavelength laser at room temperature using Metricon Model2010/M Prism Coupler.

Wire Bending During Encapsulation is determined by microscope observation and comparison between before and after encapsulation.

Reflow Stability (delamination) is determined by observation using an optical microscope with a cross polarizing filter, wherein little light scattering images indicates no delamination. The descriptor "excellent" describes no delamination condition. The descriptor "acceptable" describes little delamination condition. The descriptor "poor" describes significant delamination condition.

Thermal Cycling Stability (# of Cycles Until Wire Opening) is determined by LED light on/off testing, where failure of LEDs to light is indicative of wire opening.

Figure 3:
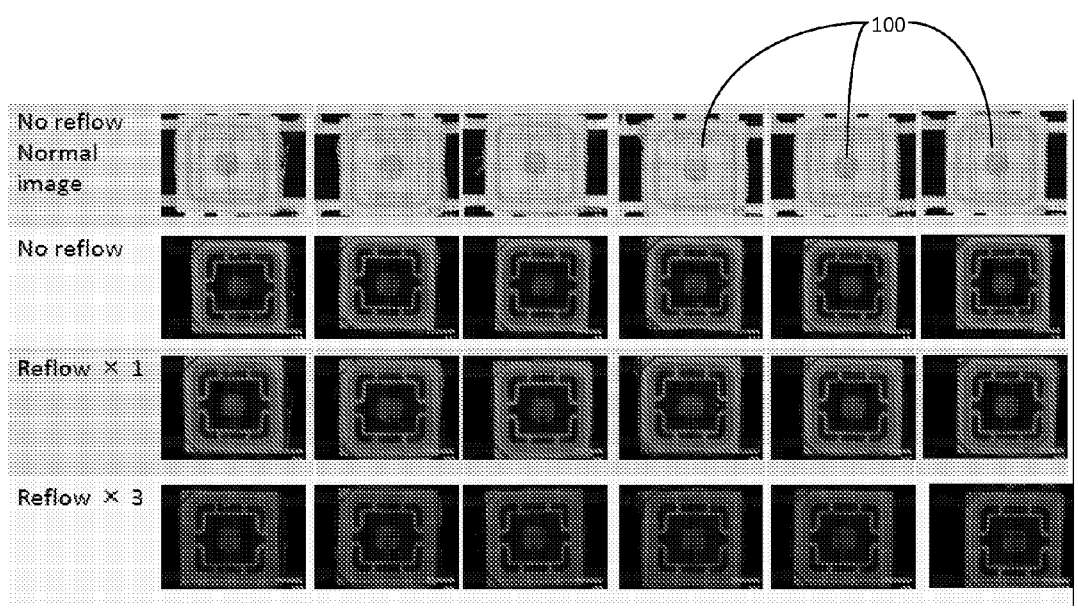
FIG. 3 is a photograph of a series of encapsulated LEDs both before and after reflow, as described in Example 2. The top line shows a normal microscope image and the lines below show cross-polarized microscope images.

More specifically, the reflow stability of Example 2 is evaluated wherein a single cycle includes exposing the sample to temperatures of −40° C. for 30 minutes ramping up to 125° C. within 2 minutes, holding at 125° C. for 30 minutes and ramping back down to −40° C. within 2 minutes. FIG. 3 shows the result of before and after reflow reflow with respect to exemplary optical assemblies 100. The top line shows normal microscope image, and the others show cross-polarized microscope images. Comparison with Comparative Example 2 (see Table 2) shows that Example 2 is more stable. No delamination from the substrate was detected. Comparative Example 2 exhibits delamination from the PPA white reflector and sometimes from the silver backplane.

Figure 4:
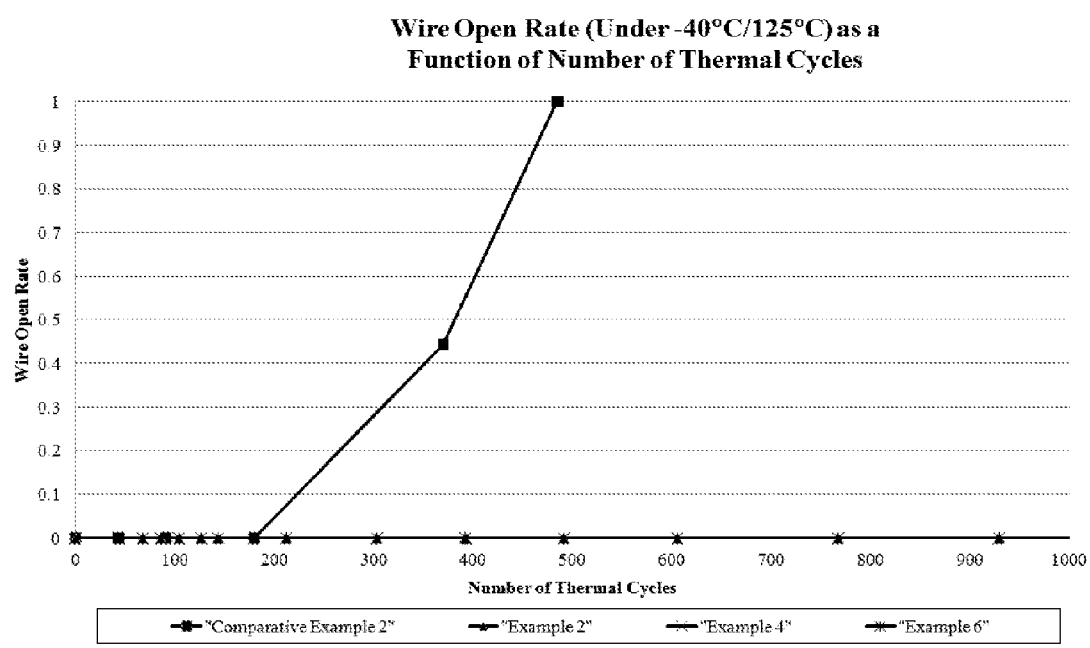
FIG. 4 is a line graph of Wire Open Rate as a Function of Number of Thermal Cycles of various examples.

FIG. 4 shows that examples 2, 4 and 6 exhibit no wire bond opening even after 1000 cycles, while comparative example 2 exhibits wire bond opening after about 200 cycles.

Additional Examples

Phosphor Incorporation into Copolymer Using 3-Roll Milling

An additional example is also formed that includes a phosphor incorporated into the organosiloxane block copolymer using 3-roll mixing. More specifically, a 4.988 g sample of Example 2 is placed on a 3-roll mill (AIMEX BR-150HCV) heated to 80° C. Subsequently, 0.497 g of Internatix phosphor YAG phosphor (NYAG4454) is added to the organosiloxane block copolymer to form a mixture. The mixture is then passed through the 3 roll mill incorporate the phosphor into the organosiloxane block copolymer.

Figure 6:
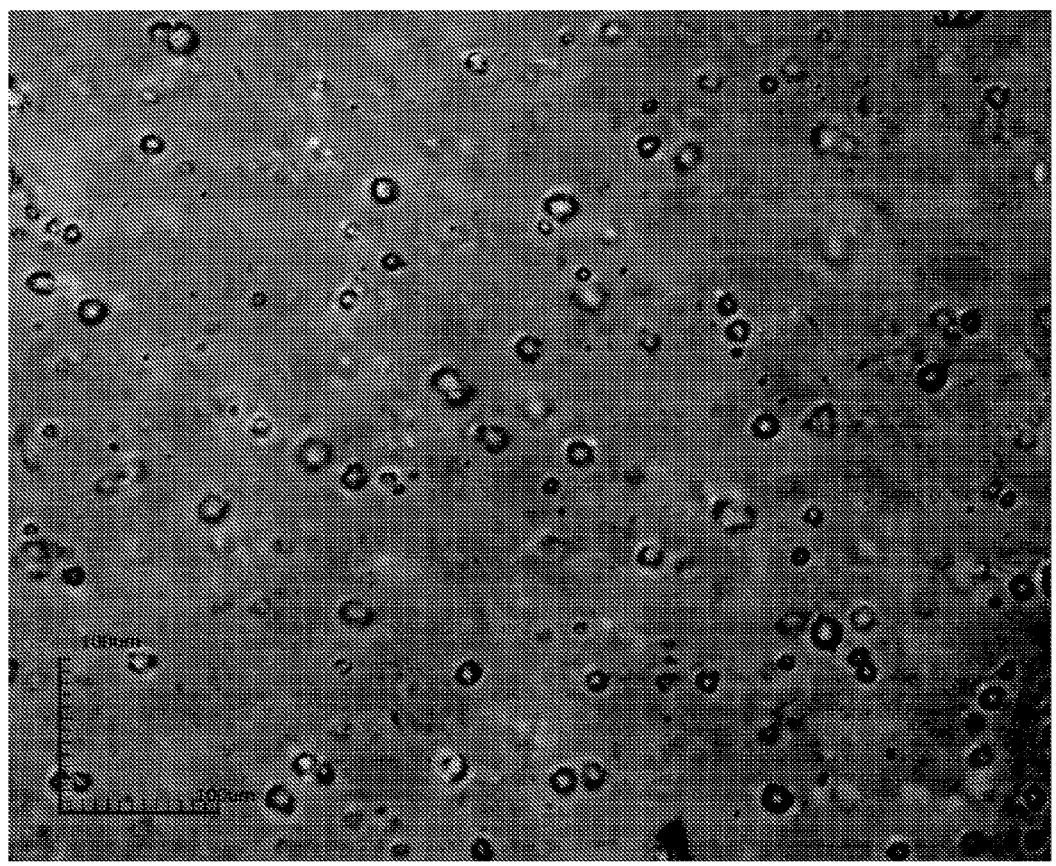
FIG. 6 is an optical micrograph, in reflection mode, of the solid composition described in Example 2. The micrograph shows a phosphor homogeneously dispersed therein.

During this process, the phosphor does not agglomerate and no sedimentation is visually observed over two months. An optical micrograph in reflection mode is set forth as FIG. 6 and shows phosphor homogeneously dispersed therein.

In contrast, when 100 parts of Comparative Example 2 are with 3.5 parts of NTAG4851 using the aforementioned method, complete sedimentation of the phosphor is observed after 24 hours.

Additional Examples

Phosphor Incorporation into Copolymer Using Solution Mixing

An additional sample of Example 2 is dissolved at 70% solids in toluene to form a mixture. Subsequently, the mixture was split into three samples. In a first sample, 25 wt % of CeYAG is added. In a second sample, 25 wt % of CeTAG is added. In a third sample, 25 wt % of EuN is added. This is repeated with samples of Example 4.

Each sample of Examples 2 and 4 is prepared in a 10 mL dental mixer cup, then hand-mixed thoroughly, then mixed with a vortex mixer for ~5 min, and then sonicated for ~45 min.

Figure 5:
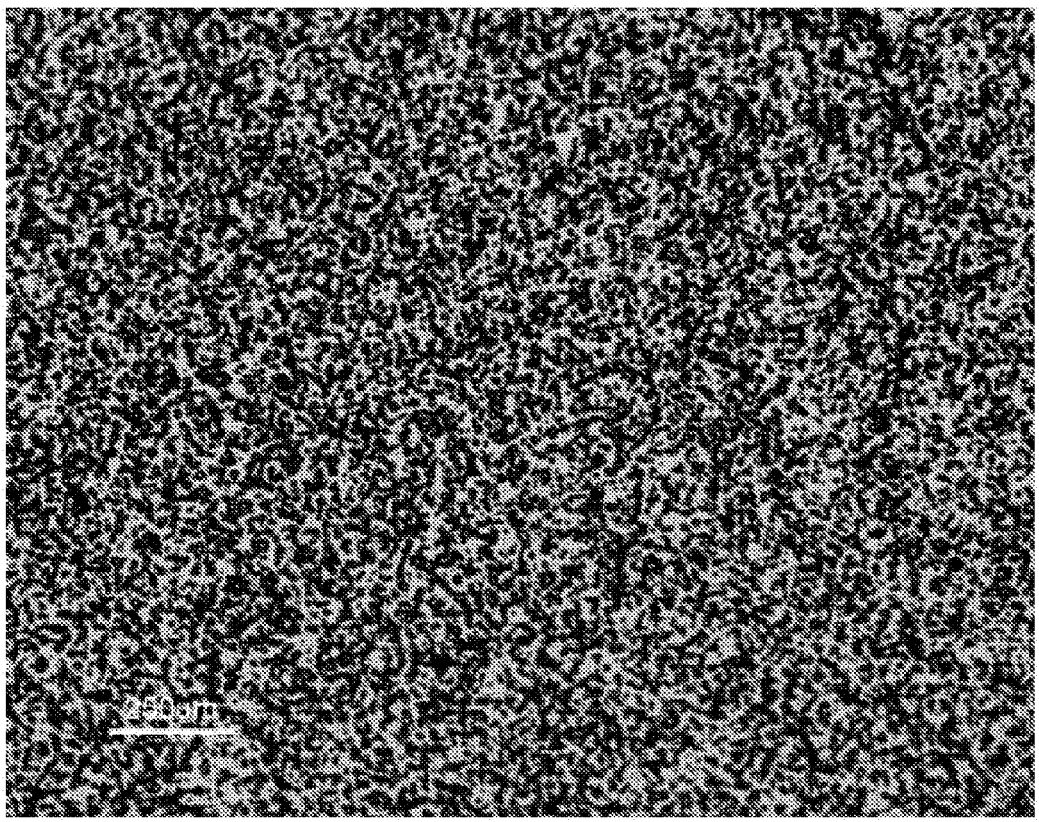
FIG. 5 is an optical micrograph, in transmission mode, of the solid composition described in Example 2. The micrograph shows a phosphor homogeneously dispersed therein.

After mixing, each sample of Examples 2 and 4 is then drawn down into a film using an adjustable draw down bar at 10 mil gap setting on a TEFZEL release liner. Each sample of Examples 2 and 4 is excellent in resisting settling of the phosphor. An optical micrograph in transmission mode of Example 2 is set forth as FIG. 5 and shows phosphor homogeneously dispersed therein.

Method

Figure 7:
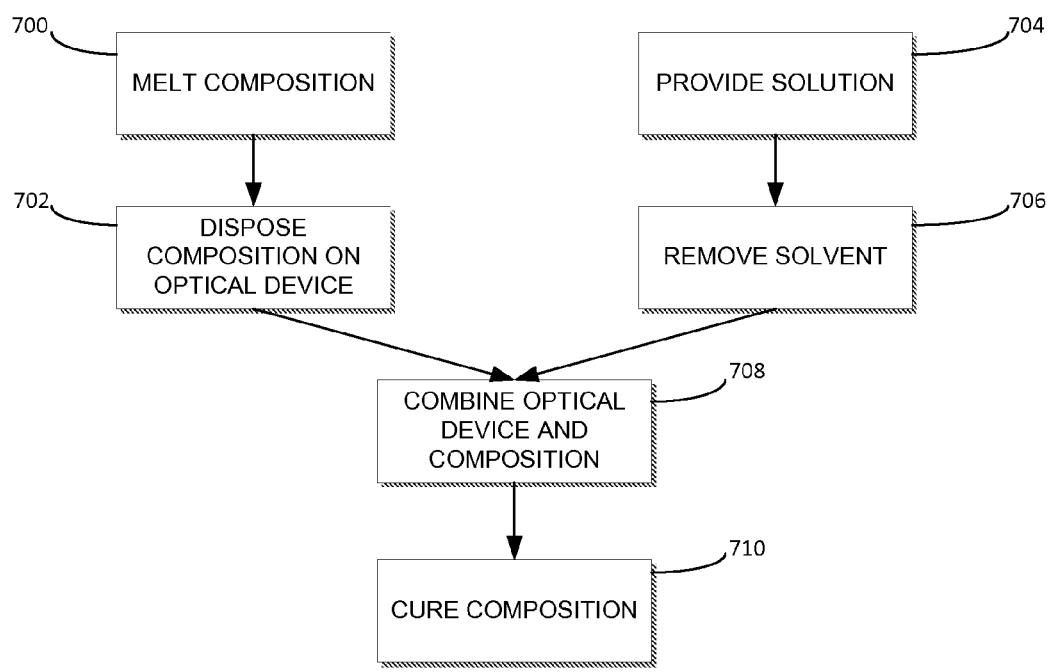
FIG. 7 is a flowchart illustrating a method of making an optical assembly, such as a solid state light.

FIG. 7 is a flowchart illustrating a method of making an optical assembly, such as a solid state light. While the flowchart will be discussed with respect to the optical assembly 100, the flowchart may apply to the optical assembly 200 or to other optical assemblies as appropriate. The method may utilize various suitable materials, such as are disclosed herein. The formation of the materials may be according to various suitable methodologies.

At 700, a composition is melted by heating the composition at least to the melting temperature of the composition.

At 702, the composition, as melted, is disposed on the optical device 104. In various examples, the composition is disposed so as to cover or substantially cover the optical surface 106. In various examples, the composition is in direct contact with the optical device 104.

At 704, in an alternative process to melting the composition, a solution of the composition in a solvent is provided. In various examples, the composition in the solution is provided on or in proximity of the optical device 104. In various examples, the optical device 104 is a coherent light source or an incoherent/partially coherent light source, such as an LED.

At 706, the solvent is substantially removed from the solution, leaving the composition substantially without the solvent.

At 708, the optical device 104 is combined with the composition. In various examples, the composition includes a phosphor. In various examples, the composition is or includes a superbase and/or a stabilizer. In various examples, the composition comprises a resin-linear organosiloxane block copolymer.

At 710, the composition is cured, such as to form the encapsulant 102. In an example, the composition is cured with condensation curing. In an example, the composition is cured at a higher temperature than the melting temperature of the composition. In various examples, the composition has a melt flow temperature of from 25° C. to 200° C.

One or more of the values described above may vary by ±5%, ±10%, ±15%, ±20%, ±25%, etc. so long as the variance remains within the scope of the disclosure. Unexpected results may be obtained from each member of a Markush group independent from all other members. Each member may be relied upon individually and or in combination and provides adequate support for specific embodiments within the scope of the appended claims. The subject matter of all combinations of independent and dependent claims, both singly and multiply dependent, is herein expressly contemplated. The disclosure is illustrative including words of description rather than of limitation. Many modifications and variations of the present disclosure are possible in light of the above teachings, and the disclosure may be practiced otherwise than as specifically described herein.

What is claimed is:

1. A method of forming an optical assembly comprising an optical device and a composition comprising a resin-linear organosiloxane block copolymer, said method comprising the step of combining the optical device and the composition to form the optical assembly, wherein the resin-linear organosiloxane block copolymer has a weight average molecular weight of at least 20,000 g/mole and comprises:
   40 to 90 mole percent disiloxy units of the formula $[R^1_2SiO_{2/2}]$ arranged in linear blocks each having an average of from 10 to 400 disiloxy units $[R^1_2SiO_{2/2}]$ per linear block;
   10 to 60 mole percent trisiloxy units of the formula $[R^2SiO_{3/2}]$ arranged in non-linear blocks each having a weight average molecular weight of at least 500/mol; and
   0.5 to 25 mole percent silanol groups;
      wherein $R^1$ is independently a $C_1$ to $C_{30}$ hydrocarbyl and $R^2$ is independently a $C_1$ to $C_{20}$ hydrocarbyl,
      wherein at least 30 weight percent of the non-linear blocks are crosslinked with another non-linear block and aggregated in nano-domains and
      wherein each linear block is linked to at least one non-linear block.

2. The method of claim 1, wherein the step of combining comprises melting the composition such that the composition is disposed on the optical device.

3. The method of claim 2, wherein the composition is in direct contact with the optical device.

4. The method of claim 1 further comprising the step of providing a solution of the composition in a solvent and optionally removing the solvent to form the composition prior to the step of combining the optical device and the composition.

5. The method of claim 4, further comprising the step of forming the composition into a sheet subsequent to the step of removing the solvent and prior to the step of combining the optical device and the composition.

6. The method of claim 1, further comprising the step of further curing the composition.

7. An optical assembly comprising an optical device and a composition comprising a resin-linear organosiloxane block copolymer, wherein the resin-linear organosiloxane block copolymer has a weight average molecular weight of at least 20,000 g/mole and comprises:
- 40 to 90 mole percent disiloxy units of the formula $[R^1{}_2SiO_{2/2}]$ arranged in linear blocks each having an average of from 10 to 400 disiloxy units $[R^1{}_2SiO_{2/2}]$ per linear block;
- 10 to 60 mole percent trisiloxy units of the formula $[R^2SiO_{3/2}]$ arranged in non-linear blocks each having a weight average molecular weight of at least 500 g/mole; and
- 0.5 to 25 mole percent silanol groups;
  wherein $R^1$ is independently a $C_1$ to $C_{30}$ hydrocarbyl and $R^2$ is independently a $C_1$ to $C_{20}$ hydrocarbyl,
  wherein at least 30 weight percent of the non-linear blocks are crosslinked with another non-linear block and aggregated in nano-domains and
  wherein each linear block is linked to at least one non-linear block.

8. The optical assembly of claim 7, wherein the optical assembly comprises a solid state light.

9. The optical assembly of claim 7, wherein the optical device comprises at least one coherent light source or incoherent/partially coherent light source.

10. The optical assembly of claim 7, wherein the optical device comprises at least one coherent light source.

11. The optical assembly of claim 7, wherein the optical device comprises at least one incoherent/partially coherent light source and the at least one incoherent/partially coherent light source comprises an LED.

12. The optical assembly of claim 7, wherein the composition is in direct contact with the optical device.

13. The optical assembly of claim 7, wherein the optical assembly comprises a phosphor.

14. The optical assembly of claim 7, wherein the disiloxy units have the formula $[(CH_3)(C_6H_5)SiO_{2/2}]$.

15. The optical assembly of claim 7, wherein the organosiloxane block copolymer comprises at least 30 weight percent disiloxy units.

16. The optical assembly of claim 7, wherein $R^2$ is phenyl.

17. The optical assembly of claim 7, wherein the composition has a melt flow temperature of from 25° C. to 200° C.

18. The optical assembly of claim 7, wherein the composition has greater than 95% light transmittance as determined using ASTM D1003.

19. The optical assembly of claim 7, wherein the composition has a refractive index greater than 1.4.

* * * * *